US008878321B2

(12) United States Patent
Aikawa et al.

(10) Patent No.: US 8,878,321 B2
(45) Date of Patent: Nov. 4, 2014

(54) MAGNETORESISTIVE ELEMENT AND PRODUCING METHOD THEREOF

(75) Inventors: Hisanori Aikawa, Yokohama (JP); Hiroaki Yoda, Kawasaki (JP); Masahiko Nakayama, Shimonoseki (JP); Tatsuya Kishi, Yokohama (JP); Sumio Ikegawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 134 days.

(21) Appl. No.: 13/618,410

(22) Filed: Sep. 14, 2012

(65) Prior Publication Data

US 2013/0069184 A1 Mar. 21, 2013

(30) Foreign Application Priority Data

Sep. 20, 2011 (JP) ................................. 2011-205361

(51) Int. Cl.
| | |
|---|---|
| *H01L 29/82* | (2006.01) |
| *H01L 21/8246* | (2006.01) |
| *H01L 43/08* | (2006.01) |
| *H01L 43/12* | (2006.01) |
| *H01L 27/22* | (2006.01) |

(52) U.S. Cl.
CPC ............ *H01L 43/12* (2013.01); *H01L 27/228* (2013.01); *H01L 43/08* (2013.01)
USPC ............................ 257/421; 257/422; 257/659

(58) Field of Classification Search
CPC ............... H01L 27/222; H01L 2924/3025; H01L 27/228; H01L 43/08; H01L 43/12
USPC ............................................. 257/422, 659
See application file for complete search history.

(56) References Cited

U.S. PATENT DOCUMENTS

| | | | |
|---|---|---|---|
| 6,956,765 B2 | 10/2005 | Saito et al. | |
| 7,307,302 B2* | 12/2007 | Saito | 257/295 |
| 7,483,291 B2 | 1/2009 | Saito et al. | |
| 7,916,521 B2 | 3/2011 | Kajiyama | |
| 8,223,533 B2 | 7/2012 | Ozeki et al. | |
| 2001/0022742 A1* | 9/2001 | Bhattacharyya | 365/171 |
| 2002/0167059 A1* | 11/2002 | Nishimura et al. | 257/421 |
| 2004/0100855 A1 | 5/2004 | Saito et al. | |
| 2005/0201147 A1* | 9/2005 | Kajiyama | 365/173 |
| 2005/0280952 A1* | 12/2005 | Kondo et al. | 360/322 |
| 2006/0034118 A1 | 2/2006 | Saito et al. | |

(Continued)

FOREIGN PATENT DOCUMENTS

| | | |
|---|---|---|
| JP | 2004-179183 A | 6/2004 |
| JP | 2008-159613 A | 7/2008 |

(Continued)

*Primary Examiner* — Long K Tran
*Assistant Examiner* — Jordan Klein
(74) *Attorney, Agent, or Firm* — Knobbe Martens Olson & Bear LLP

(57) ABSTRACT

According to one embodiment, a magnetoresistive element comprises a first magnetic layer, in which a magnetization direction is variable and is perpendicular to a film surface, a tunnel barrier layer that is formed on the first magnetic layer, and a second magnetic layer that is formed on the tunnel barrier layer, a magnetization direction of the second magnetic layer being variable and being perpendicular to the film surface. The second magnetic layer comprises a body layer that constitutes an origin of perpendicular magnetic anisotropy, and an interface layer that is formed between the body layer and the tunnel barrier layer. The interface layer has a permeability higher than that of the body layer and a planar size larger than that of the body layer.

15 Claims, 12 Drawing Sheets

(56) References Cited

U.S. PATENT DOCUMENTS

| | | |
|---|---|---|
| 2008/0165454 A1 | 7/2008 | Kajiyama |
| 2008/0253174 A1* | 10/2008 | Yoshikawa et al. ............ 365/158 |
| 2010/0032777 A1* | 2/2010 | Gao et al. ...................... 257/421 |
| 2010/0080050 A1 | 4/2010 | Ozeki et al. |
| 2010/0109061 A1* | 5/2010 | Kushida ......................... 257/295 |
| 2011/0089510 A1* | 4/2011 | Gao et al. ...................... 257/421 |
| 2011/0233697 A1* | 9/2011 | Kajiyama ...................... 257/421 |
| 2012/0068281 A1* | 3/2012 | Saida et al. .................... 257/421 |
| 2012/0074511 A1* | 3/2012 | Takahashi et al. ............. 257/427 |
| 2012/0236633 A1* | 9/2012 | Saida et al. .................... 365/173 |
| 2012/0242416 A1* | 9/2012 | Katti ............................. 331/94.1 |
| 2012/0244639 A1* | 9/2012 | Ohsawa et al. ................... 438/3 |

FOREIGN PATENT DOCUMENTS

| | | |
|---|---|---|
| JP | 2008-218829 A | 9/2008 |
| JP | 2010-080733 A | 4/2010 |
| JP | 2010-232447 A | 10/2010 |

\* cited by examiner

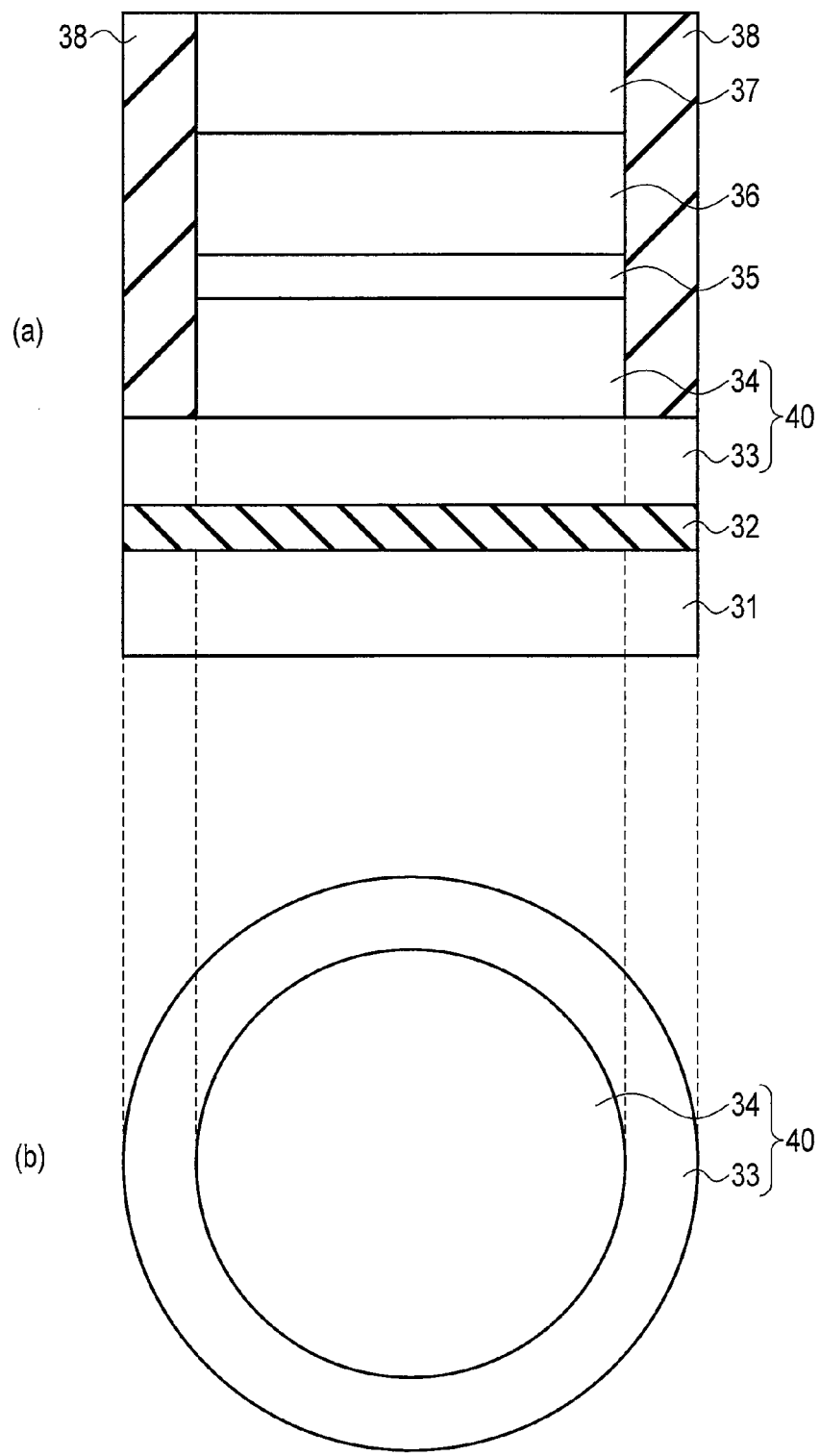
F I G. 3

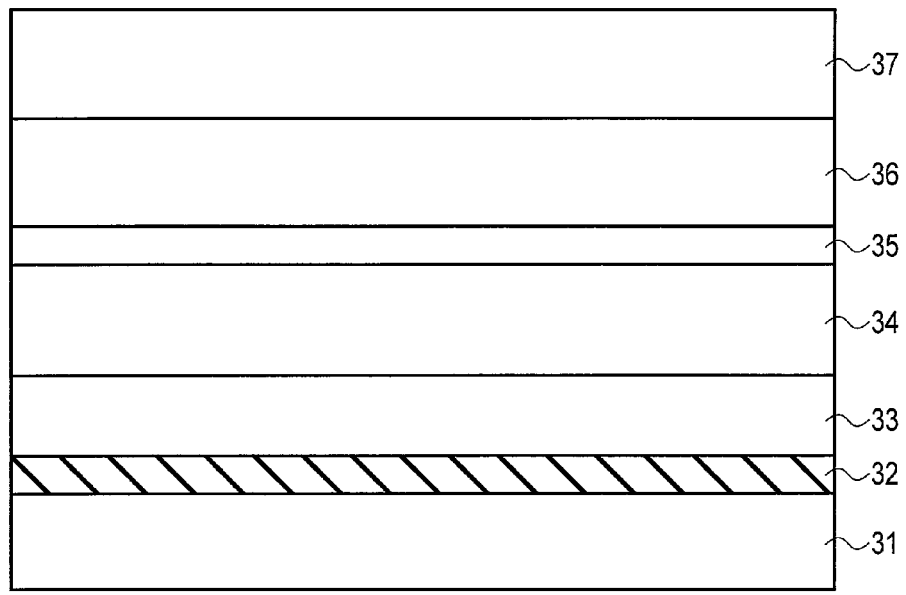
F I G. 4
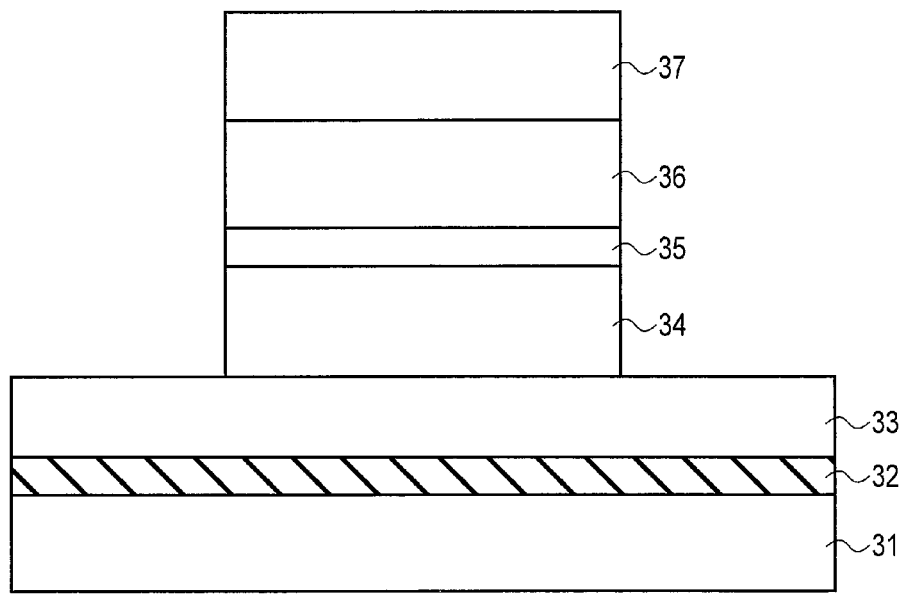
F I G. 5

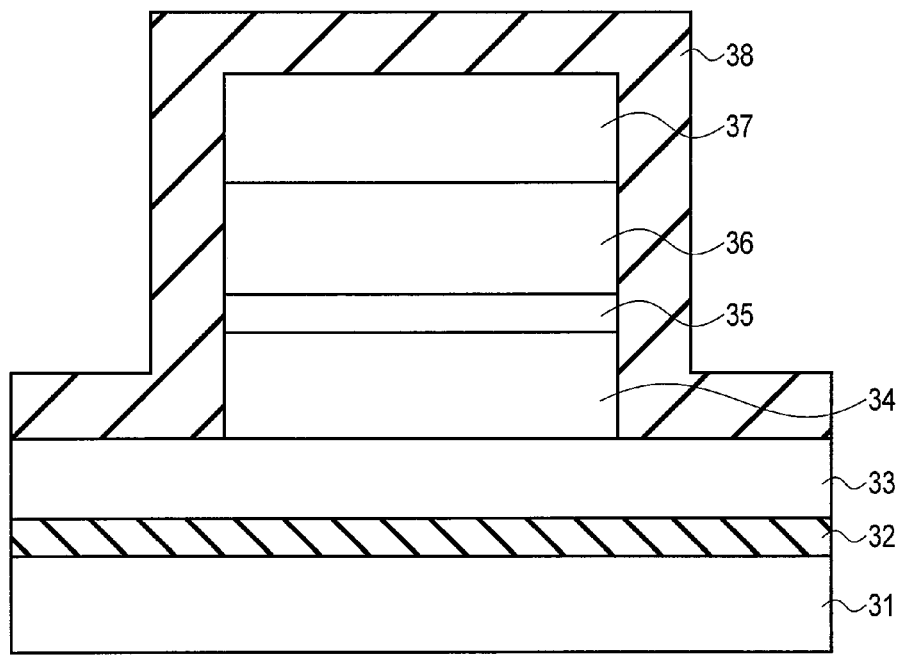
F I G. 6
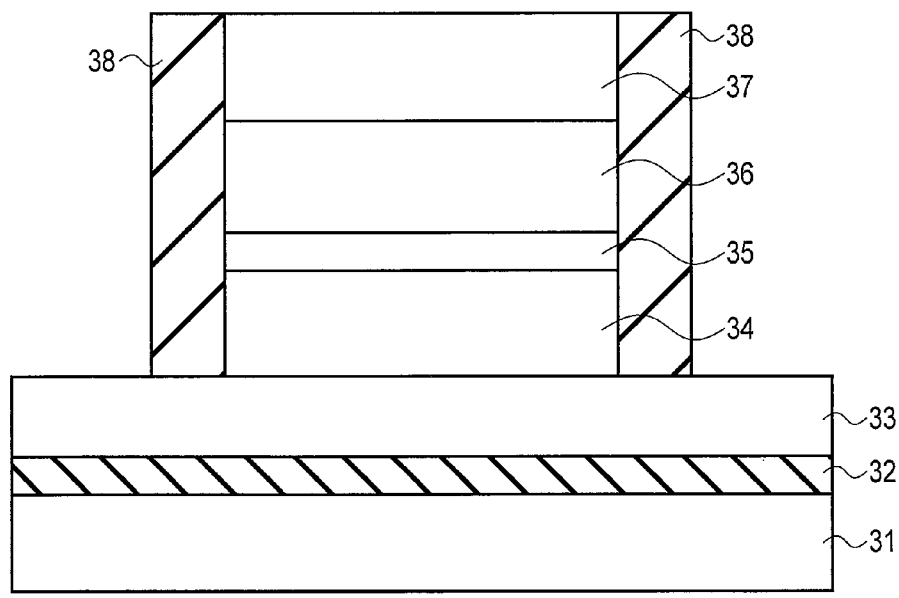
F I G. 7

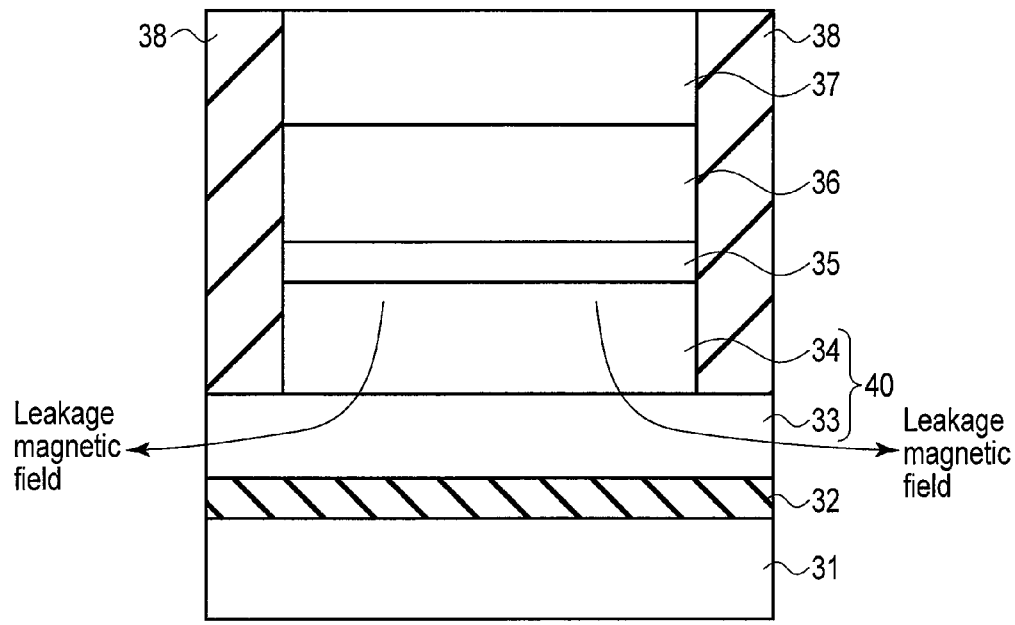
F I G. 8
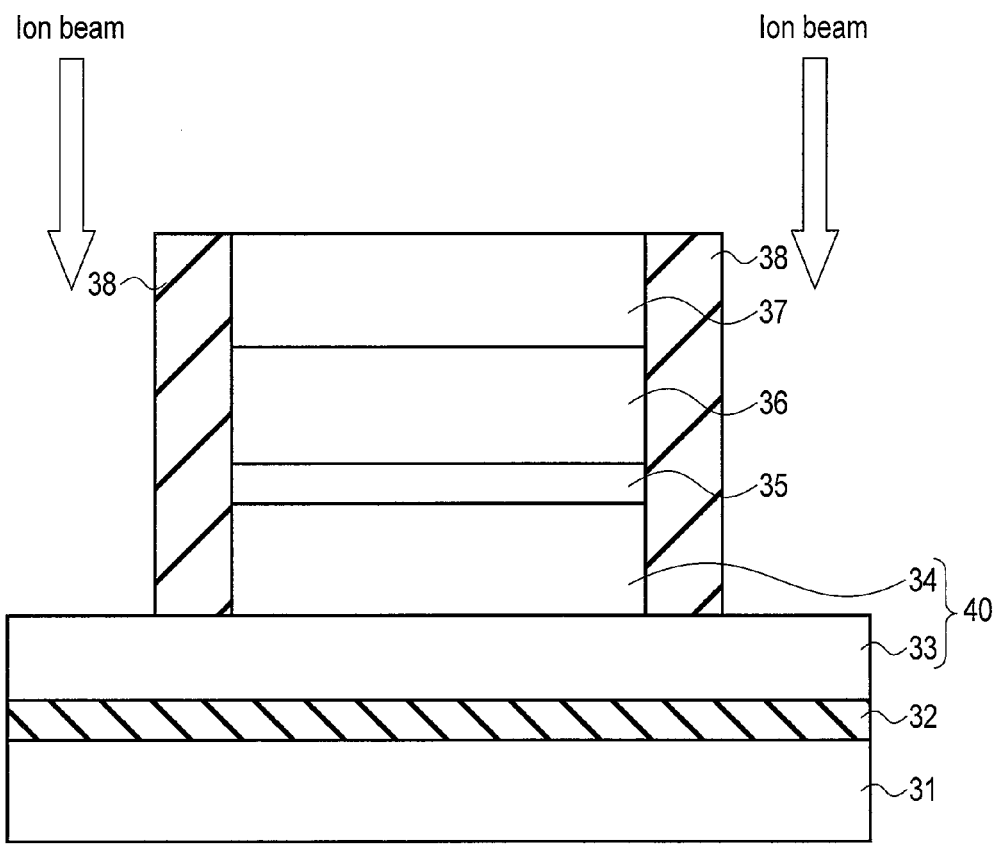
F I G. 10

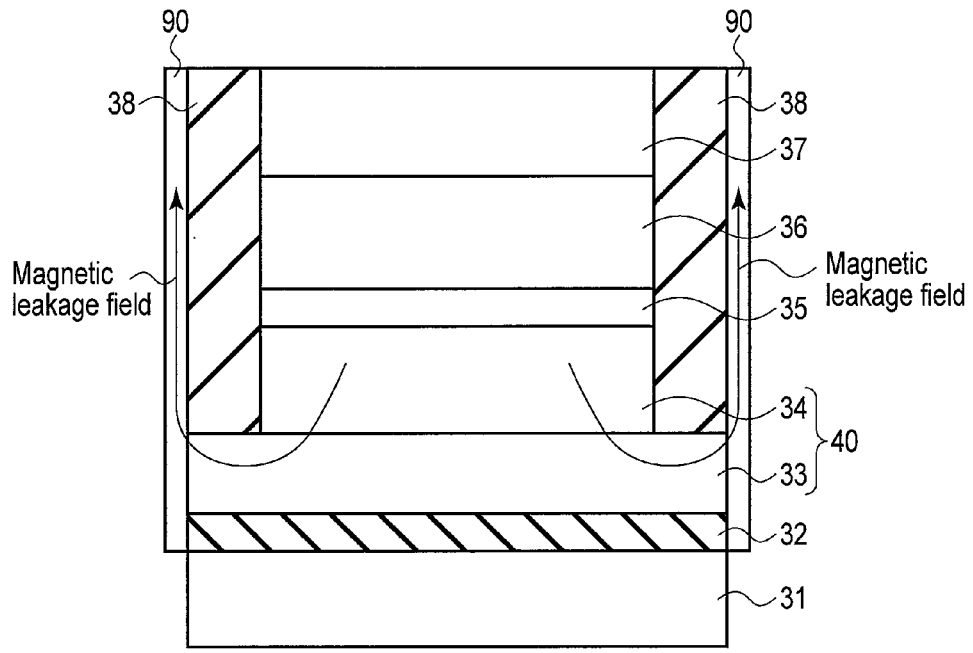
F I G. 11
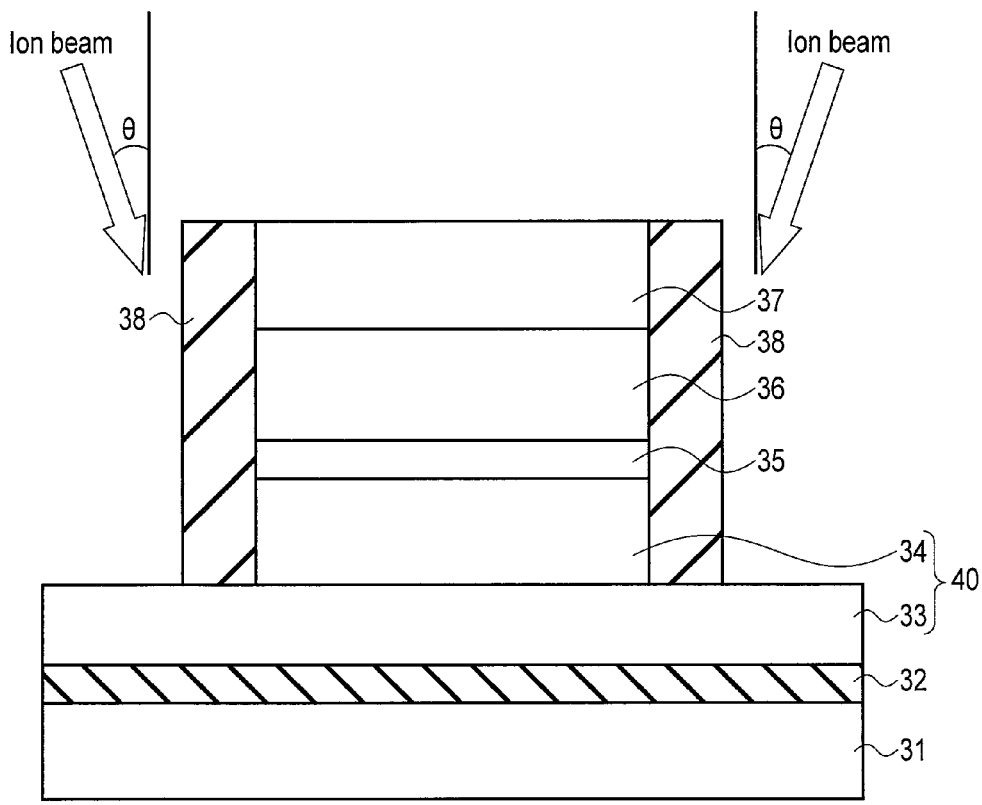
F I G. 13

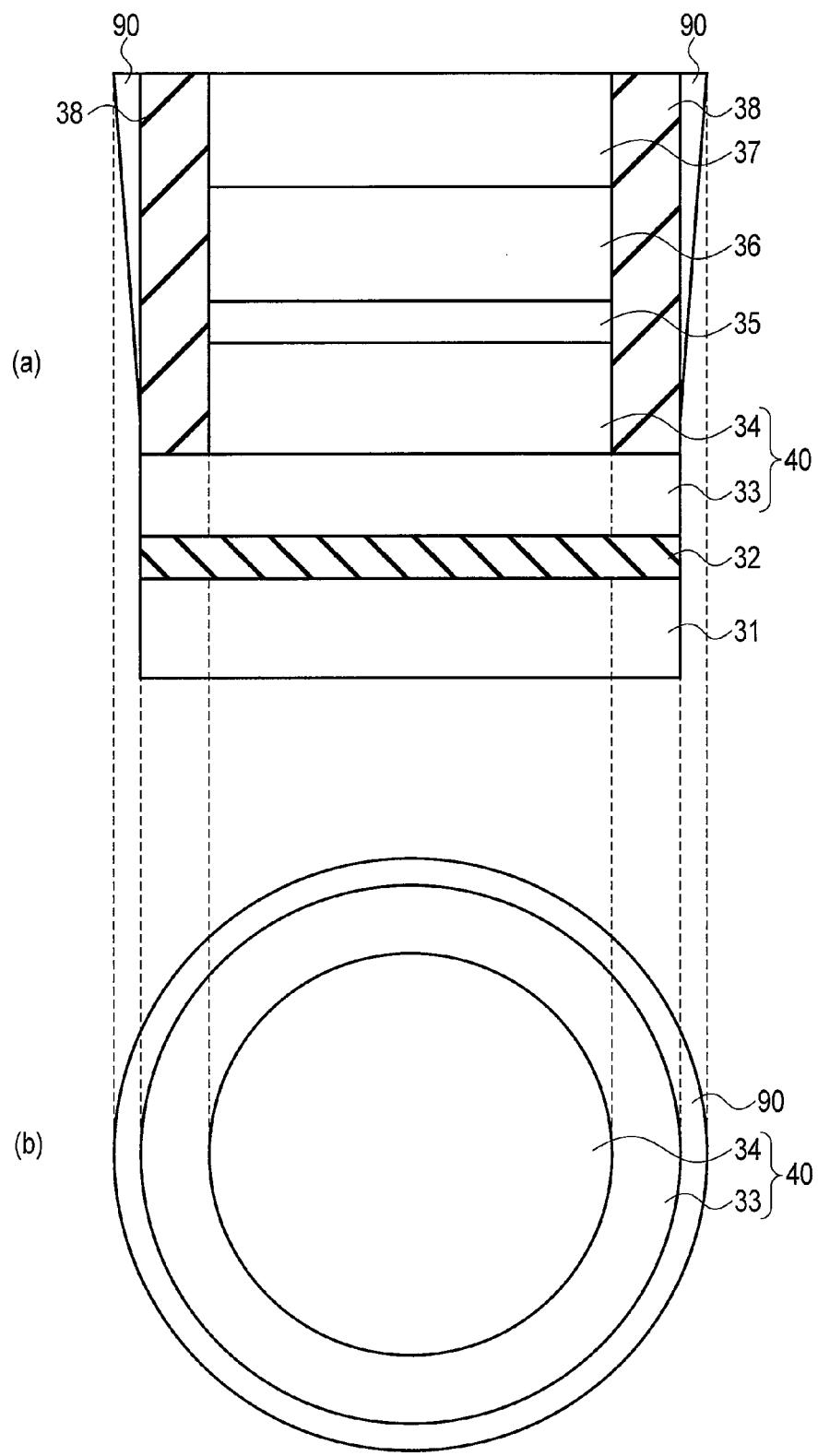
F I G. 12

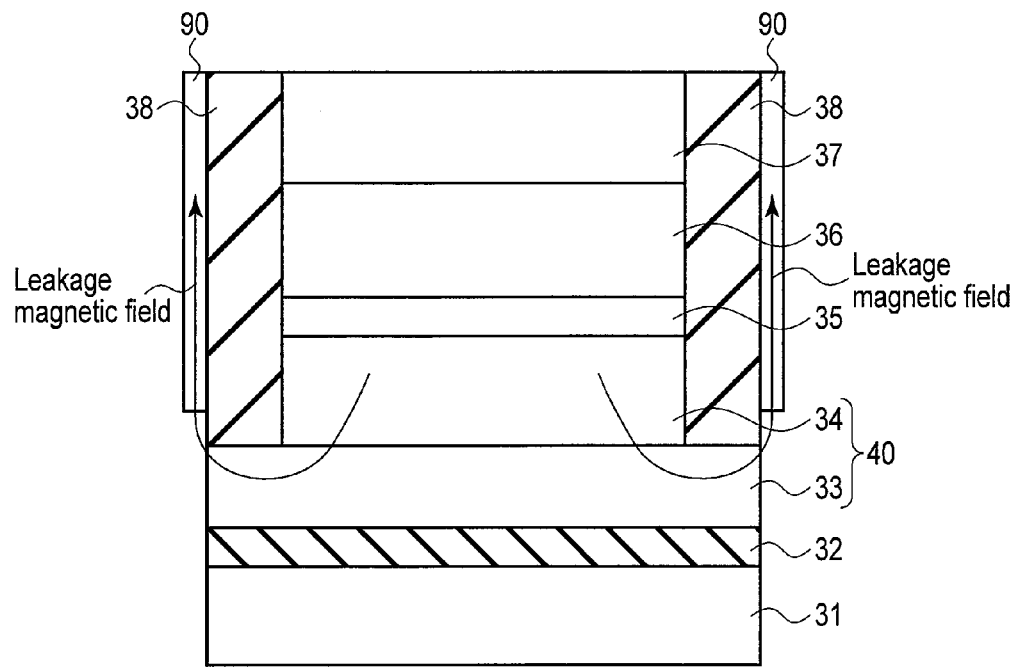
F I G. 14
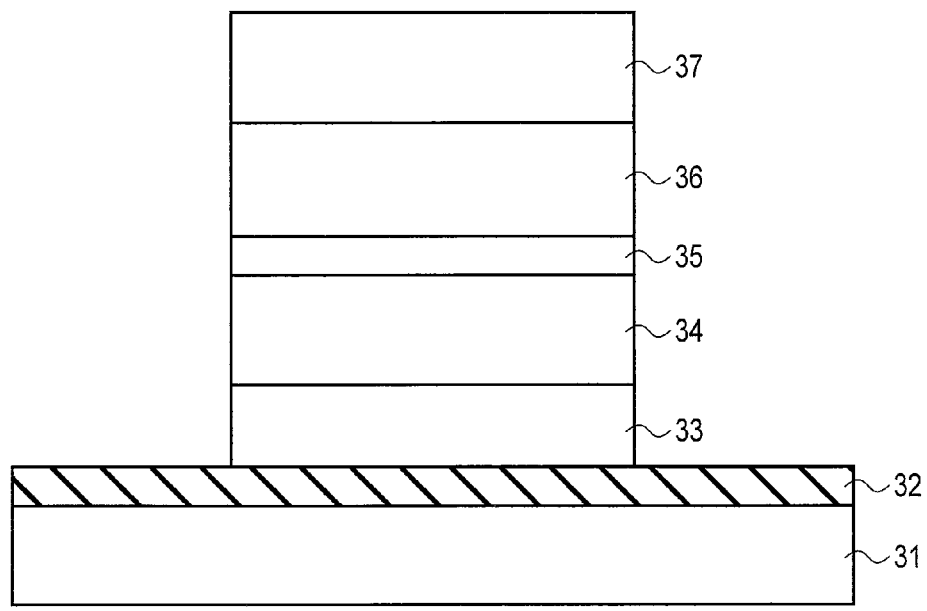
F I G. 16

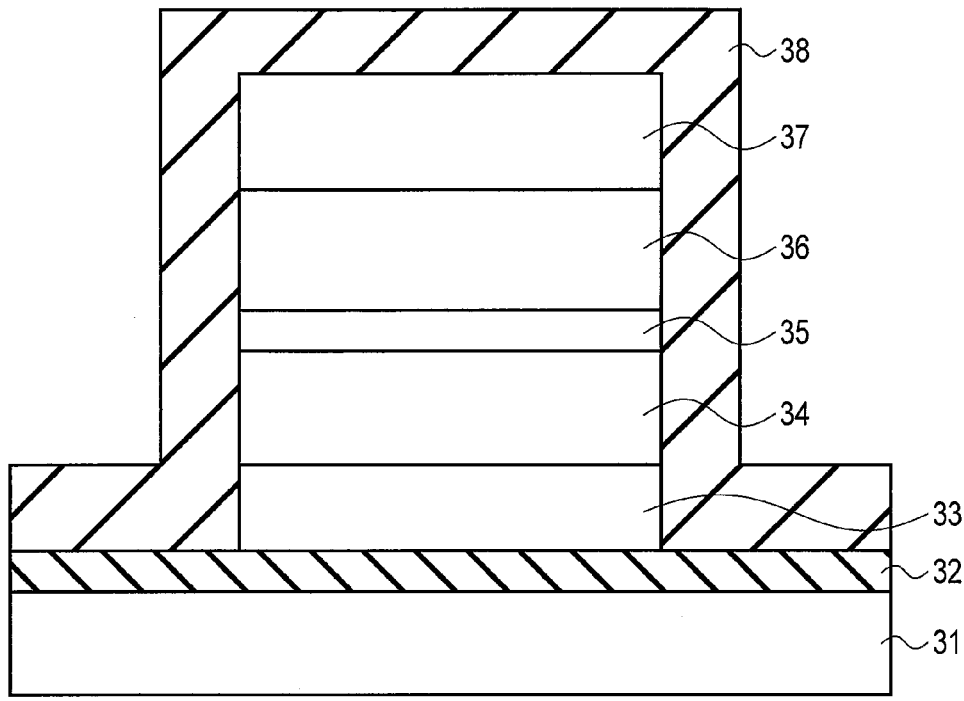
F I G. 17
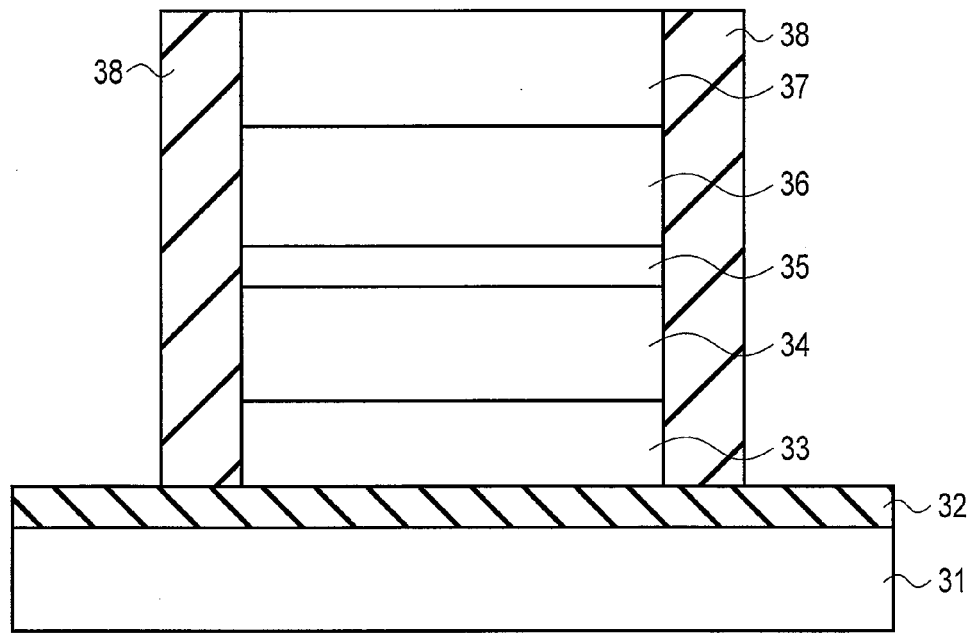
F I G. 18

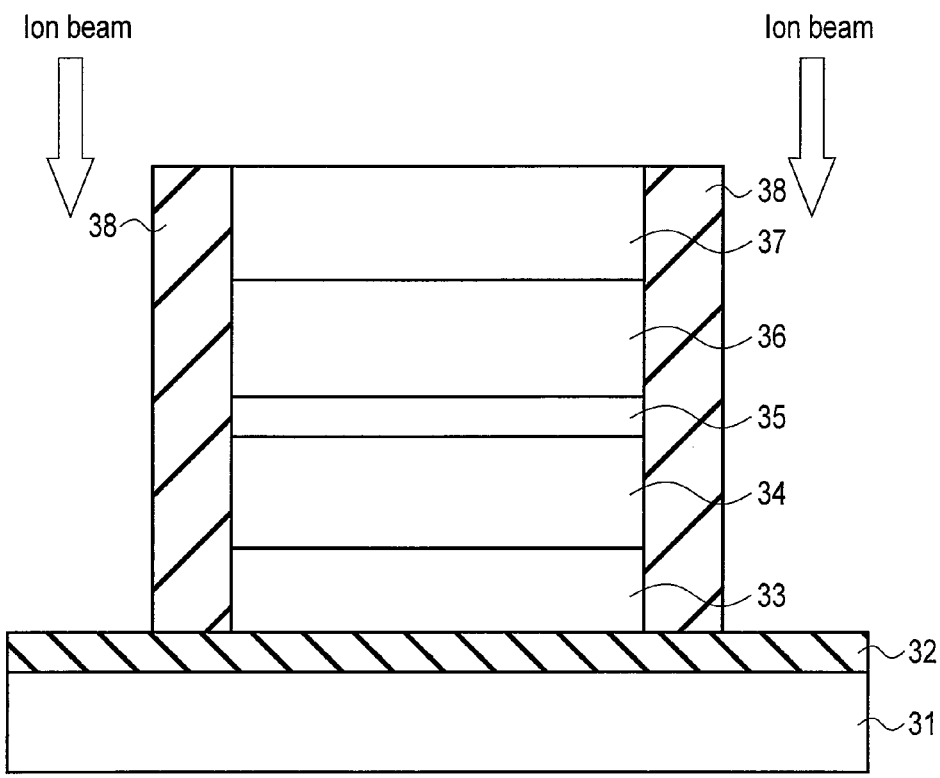
F I G. 19
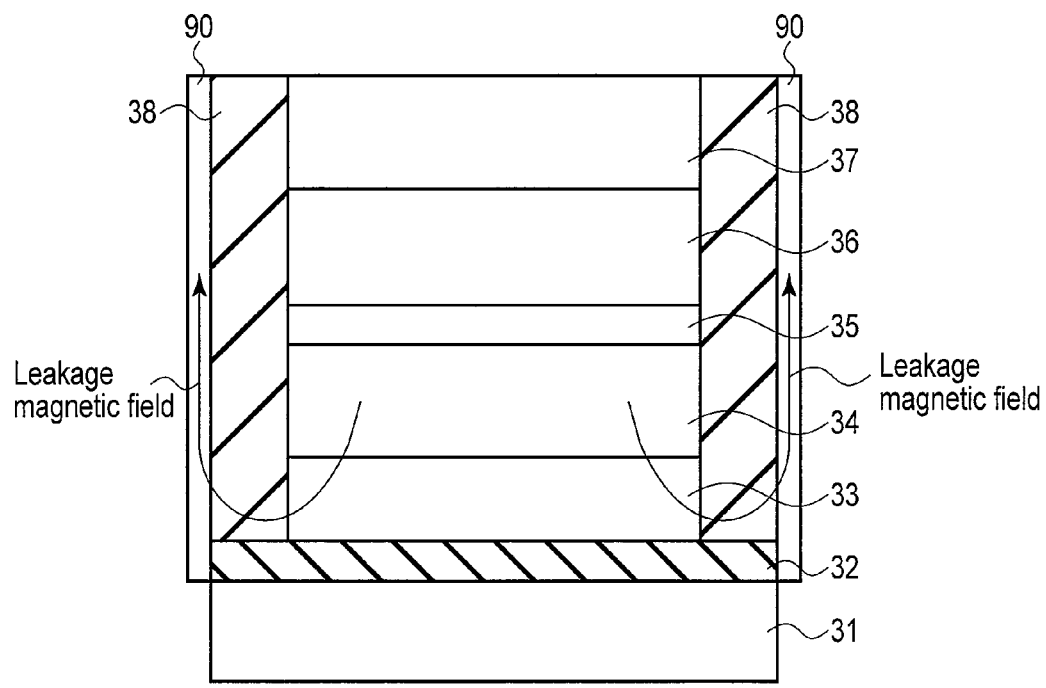
F I G. 20

MAGNETORESISTIVE ELEMENT AND PRODUCING METHOD THEREOF

CROSS-REFERENCE TO RELATED APPLICATIONS

This application is based upon and claims the benefit of priority from Japanese Patent Application No. 2011-205361, filed Sep. 20, 2011, the entire contents of which are incorporated herein by reference.

FIELD

Embodiments described herein relate generally to a magnetoresistive element and a producing method thereof.

BACKGROUND

A magnetic random access memory (MRAM) has features, such as a high-speed read/write operation of several tens of nanoseconds or less, low power consumption, and non-volatility. Therefore, the MRAM attracts attention as a universal memory having all features of a dynamic random access memory (DRAM), a static random access memory (SRAM), and a flash memory. In the MRAM, one memory element comprises a magnetic tunnel junction (MTJ) element in which information is stored and a selection transistor that selects the specific MTJ element.

The MTJ element has a structure in which a thin insulating film is formed between two ferromagnetic layers. In the MTJ element, a resistance decreases in the case that magnetization directions of two ferromagnetic layers are parallel to each other by a magnetoresistive effect, and the resistance increases in the case that the magnetization directions are antiparallel to each other. The two states are distinguished as "0" and "1" to store the information. At this point, one of the ferromagnetic layers is a reference layer in which the magnetization direction is invariable, and the other ferromagnetic layer is a storage layer in which the magnetization direction is variable.

Spin transfer is used to write "0" and "1" in the MTJ element. The spin transfer is a method in which a current having an electron, in which the magnetization direction is polarized in one direction, flows through the MTJ element to directly rewrite the magnetization direction of the storage layer. The current flowing through the MTJ element to write the information is called a write current. It is necessary to decrease the write current in order to increase a capacity of the MRAM. One of the solving methods is that the magnetization directions of the storage layer and the reference layer of the MRAM element are changed from an in-plane direction to a perpendicular direction.

However, a stray field generated from the reference layer acts on the storage layer when the reference layer has the perpendicular magnetization. Particularly, a large stray field opposite to the magnetization direction of the reference layer acts on an end portion of the storage layer. The stray field acting on the storage layer significantly disturbs coherent magnetization rotation of the storage layer during the spin transfer write, which increases the write current. Additionally, a distribution of the stray field becomes uneven with respect to the storage layer, which degrades a retention characteristic of the storage layer.

The stray field from an adjacent MTJ element also acts on the storage layer. For example, a cell size (area) equal to that of the DRAM is required when a Gbit-order MRAM is made at the same cost as the DRAM. That is, assuming that "F" is a minimum size of "lithography, the Gbit-order MRAM has cell sizes of $8F^2$ to $6F^2$. At this point, the MTJ element is produced with a cell size of $F^2$, and a distance to the adjacent MTJ element becomes about F. In the Gbit-order MRAM, F is as extremely small as about 45 nm. Because the distance between the elements is extremely small, the stray field from the reference layer acts on the adjacent element. The stray field from the adjacent element acts on the storage layer, and distribution of the stray field is uneven, which results in the increase in write current and the degradation of the retention characteristic. Additionally, because the influence of the stray field from the adjacent element depends on the element, a variation in write current increases among the elements.

BRIEF DESCRIPTION OF THE DRAWINGS

FIG. 3 is view illustrating a structure of a magnetoresistive element MTJ according to a first embodiment;

FIGS. 4 to 7 are sectional views illustrating a process of producing the magnetoresistive element MTJ of the first embodiment;

FIG. 8 is a view illustrating a stray field from a reference-layer body layer in the magnetoresistive element MTJ of the first embodiment;

FIG. 10 is a sectional view illustrating a process of producing the magnetoresistive element MTJ of the second embodiment;

FIG. 11 is a view illustrating a stray field from a reference-layer body layer in the magnetoresistive element MTJ of the second embodiment;

FIG. 12 is view illustrating a structure of a magnetoresistive element MTJ according to a third embodiment;

FIG. 13 is a sectional view illustrating a process of producing the magnetoresistive element MTJ of the third embodiment;

FIG. 14 is a view illustrating a stray field from a reference-layer body layer in the magnetoresistive element MTJ of the third embodiment;

FIGS. 16 to 19 are sectional views illustrating a process of producing the magnetoresistive element MTJ of the fourth embodiment; and FIG. 20 is a view illustrating a stray field from a reference-layer body layer in the magnetoresistive element MTJ of the fourth embodiment.

DETAILED DESCRIPTION

Figure 1:
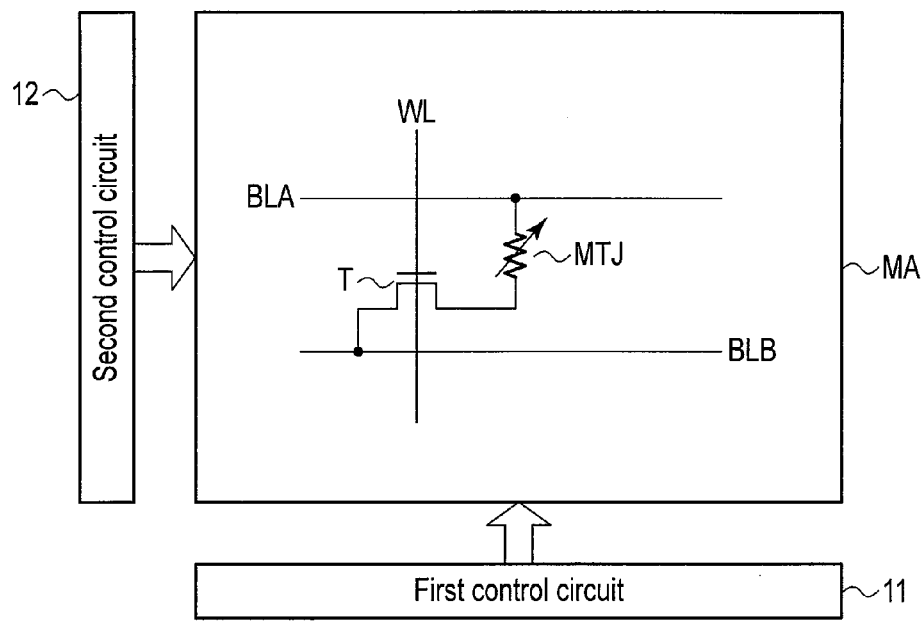
FIG. 1 is a circuit diagram illustrating a memory cell of an MRAM according to one embodiment.

In general, according to one embodiment, a magnetoresistive element comprises: a first magnetic layer, in which a magnetization direction is variable and is perpendicular to a film surface; a tunnel barrier layer that is formed on the first magnetic layer; and a second magnetic layer that is formed on the tunnel barrier layer, the magnetization direction of the second magnetic layer being variable and being perpendicular to the film surface. The second magnetic layer comprises: a body layer that constitutes an origin of perpendicular magnetic anisotropy; and an interface layer that is formed between the body layer and the tunnel barrier layer, the interface layer having permeability higher than that of the body layer and a planar size larger than that of the body layer.

Hereinafter, embodiments will be described with reference to the drawings. In the drawings, the same component is designated by the same numeral. The overlapping description is made as needed basis.

<1> Configuration Example of MRAM

A configuration example of an MRAM according to one embodiment will be described with reference to FIGS. 1 and 2.

FIG. 1 is a circuit diagram illustrating a memory cell of an MRAM according to one embodiment.

As illustrated in FIG. 1, a memory cell in a memory cell array MA comprises a series-connected body of a magnetoresistive element MTJ and a switch element (for example, a FET) T. One end (one end of magnetoresistive element MTJ) of the series-connected body is connected to a bit line BLA, and the other end is connected to the other end (one end of the switch element T) of the series-connected body is connected to a bit line BLB. For example, a control terminal of the switch element T, for example, a gate electrode of the FET is connected to a word line WL.

A potential at the word line WL is controlled by a first control circuit 11. Potentials at the bit lines BLA and BLB are controlled by a second control circuit 12.

Figure 2:
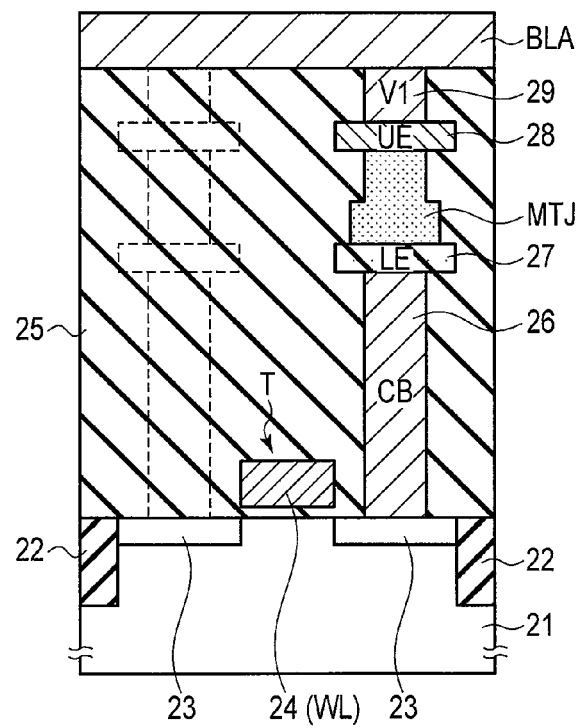
FIG. 2 is a sectional view illustrating a structure of the memory cell of the MRAM of the embodiment.

FIG. 2 is a sectional view illustrating a structure of the memory cell of the MRAM of the embodiment.

As illustrated in FIG. 2, the memory cell comprises the switch element T and the magnetoresistive element MTJ, which are disposed above a semiconductor substrate 21.

For example, the semiconductor substrate 21 is a silicon substrate. As to a conductive type of the semiconductor substrate 21, either P-type semiconductor substrate or an N-type semiconductor substrate may be used as the semiconductor substrate 21. For example, a $SiO_X$ layer having an STI structure is disposed as an element separation insulating layer 22 in the semiconductor substrate 21.

The switch element T is disposed in a surface region of the semiconductor substrate 21, specifically, an element region (active area) surrounded by the element separation insulating layer 22. In the embodiment, the switch element T is the FET, and switch element T comprises two source/drain diffusion layers 23 located in the semiconductor substrate 21 and a gate electrode 24 disposed on a channel region between the source/drain diffusion layers 23. The gate electrode 24 acts as the word line WL.

The switch element T is covered with an insulating layer (for example, $SiO_X$) 25. A contact hole is made in the insulating layer 2, and a contact via (CB) 26 is disposed in the contact hole. The contact via 26 is made of metallic materials, such as W and Cu.

A lower surface of the contact via 26 is connected to the switch element. In the embodiment, the contact via 26 directly contacts the source/drain diffusion layer 23.

A lower electrode (LE) 27 is disposed on the contact via 26. The lower electrode 27 is made of low-resistance metals, such as Ta, Ru, Ti, W, and Mo.

The magnetoresistive element MTJ is disposed immediately above the lower electrode 27, namely, the contact via 26. The magnetoresistive element MTJ of the embodiment is described in detail later.

An upper electrode (UE) 28 is disposed on the magnetoresistive element MTJ. For example, the upper electrode 28 is made of TiN. The upper electrode 28 is connected to the bit line (for example, Cu) BLA through a via (for example, Cu) 29.

<2> First Embodiment

A magnetoresistive element MTJ according to a first embodiment will be described with reference to FIGS. 3 to 8. In the magnetoresistive element MTJ of the first embodiment, the reference layer 40 comprises a reference-layer body layer 34 and a reference-layer interface layer 33, and the reference-layer interface layer 33 has permeability higher than that of the reference-layer body layer 34 and a diameter larger than that of the reference-layer body layer 34. Therefore, the magnetoresistive element MTJ can reduce a stray field that acts from the reference layer 40 (reference-layer body layer 34) on the storage layer 31. The magnetoresistive element MTJ of the first embodiment will be described in detail below.

[2-1] Structure of First Embodiment

A structure of the magnetoresistive element MTJ of the first embodiment will be described.

FIG. 3 is view illustrating the structure of the magnetoresistive element MTJ of the first embodiment. More specifically, (a) of FIG. 3 is a sectional view illustrating a structure of the magnetoresistive element MTJ, and (b) of FIG. 3 is a plan view illustrating a structure of the magnetoresistive element MTJ.

As illustrated in (a) of FIG. 3, the magnetoresistive element MTJ comprises a storage layer 31, a tunnel barrier layer 32, a reference layer 40, an AFC (anti-ferromagnetic coupling) layer 35, a shift canceling layer 36, a hard mask 37, and an insulating layer 38.

The storage layer 31 is formed on the lower electrode 27. The storage layer 31 is a magnetic layer in which a magnetization direction is variable, and the storage layer 31 has perpendicular magnetization in which the magnetization direction is perpendicular or substantially perpendicular to a film surface. As used herein, the variable magnetization direction means that the magnetization direction changes with respect to a predetermined write current. For example, a ferromagnetic material containing at least one element of Co, Fe, and Ni is used as the storage layer 31. Elements, such as B, C, and Si, may be added in order to adjust saturation magnetization or crystal magnetic anisotropy.

As used herein, the perpendicular magnetization means that a direction of residual magnetization is perpendicular or substantially perpendicular to the film surface (an upper surface and a lower surface). The term of "substantially perpendicular" means that the direction of the residual magnetization ranges from 45° to 90° with respect to the film surface.

The tunnel barrier layer 32 is formed on the storage layer 31. The tunnel barrier layer 32 is a non-magnetic layer. For example, the tunnel barrier layer 32 is made of $AlO_X$ or MgO.

The reference layer 40 is formed on the tunnel barrier layer 32. The reference layer 40 is a magnetic layer in which the magnetization direction is invariable, and the reference layer 40 has the perpendicular magnetization in which the magnetization direction is perpendicular or substantially perpendicular to the film surface. As used herein, the invariable magnetization direction means that the magnetization direction does not change with respect to the write current. That is, the reference layer 40 is larger than the storage layer 31 in an inversion threshold in the magnetization direction.

The reference layer 40 comprises a reference-layer interface layer 33 formed on a lower side and a reference-layer body layer 34 formed on an upper side. That is, the reference-layer interface layer 33 is formed on the tunnel barrier layer 32, and the reference-layer body layer 34 is formed on the reference-layer interface layer 33. The reference-layer body layer 34 constitutes an origin of perpendicular magnetic anisotropy. The reference-layer interface layer 33 is formed between the reference-layer body layer 34 and the tunnel barrier layer 32 for the purpose of lattice matching at an interface between the reference-layer body layer 34 and the tunnel barrier layer 32. The reference-layer interface layer 33 and the reference-layer body layer 34 are described in detail later.

The AFC layer 35 is formed on the reference layer 40 (the reference-layer body layer 34). The AFC layer 35 is noble metals, such as Ru, which establishes antiferromagnetic coupling of the reference layer 40 and the shift canceling layer 36.

The shift canceling layer 36 is formed on the AFC layer 35. The shift canceling layer 36 is a magnetic layer in which the magnetization direction is invariable, and the shift canceling layer 36 has the perpendicular magnetization in which the magnetization direction is perpendicular or substantially perpendicular to the film surface. The magnetization direction of the shift canceling layer 36 is opposite to the magnetization direction of the reference layer 40. Therefore, the shift canceling layer 36 can cancel a stray field from the reference layer 40 in the direction perpendicular to the film surface. For example, the shift canceling layer 36 is made of Fe, Co, Pt, or Pd.

A shift canceling layer (not illustrated) in which the magnetization direction is opposite to the adjusting layer 36 may be formed between the lower electrode 27 and the storage layer 31.

The hard mask 37 is formed on the shift canceling layer 36. The hard mask 37 is made of a metallic material in which an etching rate is lower than etching rates of the storage layer 31, the tunnel barrier layer 32, the reference layer 40, the AFC layer 35, and the shift canceling layer 36. For example, the hard mask 37 is made of Ta, Ti, or a nitride thereof. The upper electrode 27 is formed on the hard mask 37.

In the first embodiment, as illustrated in (b) of FIG. 3, a planar size (for example, an area or a diameter) of the reference-layer interface layer 33 is larger than that of the reference-layer body layer 34. The reference-layer body layer 34 is located in a central portion in a plane of the reference-layer interface layer 33. In other words, an end portion in the plane of the reference-layer interface layer 33 projects from an end portion in the plane of the reference-layer body layer 34, thereby suppressing action of the stray field from the reference-layer body layer 34 on an end portion of the storage layer 31.

In the first embodiment, the case that the magnetoresistive element MTJ has a circular planar shape is described. Therefore, a diameter is cited as an example of the planar size. However, there is no particular limitation to the planar shape of the magnetoresistive element MTJ, but the magnetoresistive element MTJ may be formed into a square shape, a rectangular shape, or an ellipsoidal shape.

More specifically, the diameter of the reference-layer interface layer 33 is larger than that of the reference-layer body layer 34, and a difference between the diameters is greater than or equal to 1 nm, desirably ranges from 2 nm to 10 nm.

The lower limit (2 nm) is decided as a result of sufficiently considering that the stray field from the reference-layer body layer 34 does not act on the end portion of the storage layer 31. That is, in the case that the difference in diameter between the reference-layer interface layer 33 and the reference-layer body layer 34 is less than 2 nm, the stray field from the reference-layer body layer 34 acts on the end portion of the storage layer 31.

On the other hand, the upper limit (10 nm) is decided in consideration of an MR (Magneto Resistivity) ratio of the magnetoresistive element MTJ. Generally, although a current flows through the reference-layer interface layer 33 located outside the reference-layer body layer 34, the MR ratio thereof is reduced by about 10% compared with other portions. Therefore, the MR ratio of the reference-layer interface layer 33 is reduced when the diameter of the reference-layer interface layer 33 is excessively larger than that of the reference-layer body layer 34. In order to produce the Gbit-order MRAM, it is necessary that the MR ratio of the magnetoresistive element MTJ be greater than or equal to 100%. In consideration of this fact, desirably the difference in diameter between the reference-layer interface layer 33 and the reference-layer body layer 34 is less than or equal to 10 nm.

The diameter of the reference-layer interface layer 33 is substantially equal to the diameters of the tunnel barrier layer 32 and the storage layer 31, which are located below the reference-layer interface layer 33. On the other hand, the diameter of the reference-layer body layer 34 is substantially equal to the diameters of the AFC layer 35, the shift canceling layer 36, and the hard mask 37, which are located above the reference-layer body layer 34.

The reference-layer interface layer 33 is made of a material having the permeability higher than that of the reference-layer body layer 34, namely, a soft magnetic material. More specifically, for example, a ferromagnetic material containing at least one element of Co, Fe, and Ni is used as the reference-layer interface layer 33. Elements, such as B, may be added to the reference-layer interface layer 33. On the other hand, the reference-layer body layer 34 is made of a material having the permeability lower than that of the reference-layer interface layer 33. For example, the reference-layer body layer 34 is made of an alloy of a ferromagnetic material containing Co, Fe, Pt, or Pd or a stacked structure thereof. The permeability of the reference-layer interface layer 33 is higher than the permeability of the reference-layer body layer 34, which allows the stray field from the reference-layer body layer 34 to be concentrated along the reference-layer interface layer 33. That is, the stray field from the reference-layer body layer 34 does not act on the storage layer 31.

More specifically, desirably relative permeability (a ratio of the permeability of the reference-layer interface layer 33 and the permeability in vacuum) of the reference-layer interface layer 33 is greater than or equal to 50. This is because the stray field acting on the storage layer 31 is rapidly reduced in the case that the relative permeability of the reference-layer interface layer 33 is greater than or equal to 50 in a magnetostatic simulation.

Desirably a film thickness of the reference-layer interface layer 33 ranges from 0.3 nm to 5 nm.

The lower limit (0.3 nm) is decided as a result of sufficiently considering that the stray field from the reference-layer body layer 34 does not act on the end portion of the storage layer 31. That is, in the case that the film thickness of the reference-layer interface layer 33 is less than 0.3 nm, the stray field from the reference-layer body layer 34 acts on the end portion of the storage layer 31.

On the other hand, the upper limit (5 nm) is decided in consideration of the stray field from the reference-layer interface layer 33 itself. That is, in the case that the film thickness of the reference-layer interface layer 33 is greater than 5 nm, the stray field from the reference-layer interface layer 33 acts on the storage layer 31.

More specifically, the relative permeability of the reference-layer interface layer 33 is set to 50, and the film thickness is varied to perform the magnetostatic simulation. At this point, the stray field acting on the storage layer 31 from the reference layer 40 decreases when the film thickness ranges from 0.3 nm to 5 nm. However, the stray field acting on the storage layer 31 from the reference layer 40 increases when the film thickness is less than 0.3 nm, or when the film thickness is greater than 5 nm.

The insulating layer 38 is formed on side surfaces of the reference-layer body layer 34, the AFC layer 35, the shift canceling layer 36, and the hard mask 37, and on an upper surface of projected end portion of the reference-layer interface layer 33. In other words, the insulating layer 38 is formed so as to cover surroundings of the reference-layer body layer 3, the AFC layer 35, the shift canceling layer 36, and the hard mask 37. The insulating layer 38 is made of materials, such as SiN, $SiO_X$, $AlO_X$, An, MgO, and BN, which have etching rates lower than those of the storage layer 31, the tunnel barrier layer 32, and the reference-layer interface layer 33.

Although described in detail later, the reference-layer interface layer 33, the tunnel barrier layer 32, and the storage layer 31 are etched with the insulating layer 38 as a mask. Therefore, an outer diameter of the insulating layer 38 is substantially equal to outer diameters of the reference-layer interface layer 33, the tunnel barrier layer 32, and the storage layer 31. That is, a double of the film thickness (the film thickness from the side surface) of the insulating layer 38 is the difference in diameter between the reference-layer interface layer 33 and the reference-layer body layer 34. As described above, the difference in diameter between the reference-layer interface layer 33 and the reference-layer body layer 34 ranges from 2 nm to 10 nm. Therefore, desirably the film thickness of the insulating layer 38 ranges from 1 nm to 5 nm.

In the first embodiment, for example, the magnetoresistive element MTJ is a spin transfer type magnetoresistive element. Accordingly, in the case that data is written in the magnetoresistive element MTJ or in the case that the data is read from the magnetoresistive element MTJ, the current flows bidirectionally through the magnetoresistive element MTJ in the direction perpendicular to the film surface.

More specifically, the data is written in the magnetoresistive element MTJ in the following manner.

In the case that electrons (electrons travel from the reference layer 40 toward the storage layer 31) are supplied from the side of the upper electrode 28, the electrons in which spins are polarized in the same direction as the magnetization direction of the reference layer 40 are injected into the storage layer 31. In this case, the magnetization direction of the storage layer 31 is aligned with the same direction as the magnetization direction of the reference layer 40. Therefore, the magnetization directions of the reference layer 40 and the storage layer 31 are arrayed so as to be parallel to each other. In the parallel array, the resistance of the magnetoresistive element MTJ is minimized. For example, the parallel array is defined as the data of "0".

On the other hand, in the case that electrons (electrons travel from storage layer 31 toward the reference layer 40) are supplied from the side of the lower electrode 27, the electrons are reflected from the reference layer 40, and the electrons in which the spins are polarized in the opposite direction to the magnetization direction of the reference layer 40 are injected into the storage layer 31. In this case, the magnetization direction of the storage layer 31 is aligned with the opposite direction to the magnetization direction of the reference layer 40. Therefore, the magnetization directions of the reference layer 40 and the storage layer 31 are arrayed so as to be antiparallel to each other. In the antiparallel array, the resistance of the magnetoresistive element MTJ is maximized. For example, the parallel array is defined as the data of "1".

The data read is performed as follows.

A read current is supplied to the magnetoresistive element MTJ. The read current is set to a value (smaller than the write current) in which the magnetization direction of the storage layer 31 is not inverted. A semiconductor device that can perform the memory operation is obtained by detecting a change in resistance of the magnetoresistive element MTJ.

[2-2] Producing Method of First Embodiment

A method for producing the magnetoresistive element MTJ of the first embodiment will be described below.

FIGS. 4 to 7 are sectional views illustrating a process of producing the magnetoresistive element MTJ of the first embodiment.

As illustrated in FIG. 4, for example, the storage layer 31 is formed on the lower electrode 27 by a chemical vapor deposition (CVD) method, a physical vapor deposition (PVD) method or an atomic layer deposition (ALD) method. The storage layer 31 is a magnetic layer. For example, the storage layer 31 is made of a ferromagnetic material containing at least one element of Co, Fe, and Ni.

Then, for example, the tunnel barrier layer 32 is formed on the storage layer 31 by the CVD method, the PVD method, or the ALD method. The tunnel barrier layer 32 is a non-magnetic layer. For example, the tunnel barrier layer 32 is made of $AlO_X$ or MgO.

Then, for example, the reference-layer interface layer 33 is formed on the tunnel barrier layer 32 by the CVD method, the PVD method, or the ALD method. The reference-layer interface layer 33 is made of a material having permeability higher than that of the reference-layer body layer 34, namely, the ferromagnetic material. More specifically, the reference-layer interface layer 33 is a magnetic layer. For example, the reference-layer interface layer 33 is made of a ferromagnetic material containing at least one element of Co, Fe, and Ni. Elements, such as B, may be added to the reference-layer interface layer 33. Desirably the film thickness of the reference-layer interface layer 33 ranges from 0.3 nm to 5 nm.

Then, for example, the reference-layer body layer 34 is formed on the reference-layer interface layer 33 by the CVD method, the PVD method, or the ALD method. The reference-layer body layer 34 is a magnetic layer, and made of a material having the permeability lower than that of the reference-layer interface layer 33. For example, the reference-layer body layer 34 is made of a ferromagnetic material containing Co, Fe, Pt, or Pd or a stacked structure thereof.

Then, for example, the AFC layer 35 is formed on the reference-layer body layer 34 by the CVD method, the PVD method, or the ALD method. The AFC layer 35 is a magnetic layer, and made of antiferromagnetic materials, such as Ru.

Then, for example, the shift canceling layer 36 is formed on the AFC layer 35 by the CVD method, the PVD method, or the ALD method. The shift canceling layer 36 is a magnetic layer. For example, the shift canceling layer 36 is made of Pt, Pd, or Ir.

Then, for example, the hard mask 37 is formed on the shift canceling layer 36 by the CVD method, the PVD method, or the ALD method. The hard mask 37 is made of a metallic material having an etching rate lower than the etching rates of the storage layer 31, the tunnel barrier layer 32, the reference layer 40, the AFC layer 35, and the shift canceling layer 36. In the case that the etching process is performed by IBE (Ion Beam Etching), the shift canceling layer 36 is made of, for example, Ta, Ti, or a nitride thereof.

As illustrated in FIG. 5, a resist mask (not illustrated) is formed on the hard mask 37 to perform photolithography.

Then, using a resist mask, the hard mask 37 is processed by, for example, RIE (Reactive Ion Etching). At this point, the hard mask 37 is processed such that the planar shape of the hard mask 37 becomes the circular shape. Then the resist mask is removed.

Then, with the hard mask 37 as a mask, the shift canceling layer 36, the AFC layer 35, and the reference-layer body layer 34 are processed by the RIE or the IBE. Therefore, an upper surface of the reference-layer interface layer 33 is exposed in a region where the shift canceling layer 36, the AFC layer 35, and the reference-layer body layer 34 are etched.

As illustrated in FIG. 6, for example, the insulating layer 38 is formed in a conformal manner (evenly formed over the surface) by the CVD method, the PVD method, or the ALD method. That is, the insulating layer 38 is formed on the upper surface of the reference-layer interface layer 33, the side surfaces of the reference-layer body layer 34, the AFC layer 35, the shift canceling layer 36, and the hard mask 37, and the upper surface of the hard mask 37. The insulating layer 38 is made of a material having the etching rate lower than the etching rates of the storage layer 31, the tunnel barrier layer 32, and the reference-layer interface layer 33. For example, the insulating layer 38 is made of SiN, $SiO_X$, $AlO_X$, AlN, MgO, or BN.

For example, the insulating layer 38 is formed with film thicknesses of 2 nm to 6 nm. The insulating layer 38 is partially etched in a process of etching the storage layer 31, the tunnel barrier layer 32, and the reference-layer interface layer 33. Therefore, the film thickness of the insulating layer 38 is set so as to be finally left in a range of 1 nm to 5 nm. In order to form the insulating layer 38 in the conformal manner, desirably the insulating layer 38 is formed by the ALD method.

As illustrated in FIG. 7, the insulating layer 38 is removed from the upper surfaces of the hard mask 37 and the reference-layer interface layer 33 by anisotropic etching, for example, the RIE. Therefore, the insulating layer 38 is left on the side surfaces of the reference-layer body layer 34, the AFC layer 35, the shift canceling layer 36, and the hard mask 37.

Then, as illustrated in FIG. 3, with the hard mask 37 and the insulating layer 38 as a mask, the reference-layer interface layer 33, the tunnel barrier layer 32, and the storage layer 31 are processed by the RIE or the IBE. Therefore, the storage layer 31, tunnel barrier layer 32, and the reference-layer interface layer 33 are processed such that the diameters of the storage layer 31, tunnel barrier layer 32, and the reference-layer interface layer 33 are larger than those of the reference-layer body layer 34, the AFC layer 35, the shift canceling layer 36, and the hard mask 37 by a double of the film thickness of the insulating layer 38. The storage layer 31, tunnel barrier layer 32, and the reference-layer interface layer 33 are processed such that the difference between the diameters ranges from 2 nm to 10 nm.

The difference in diameter between the reference-layer interface layer 33 and the reference-layer body layer 34 can be decided by the film thickness of the insulating layer 38. The insulating layer 38 is partially etched in etching the reference-layer interface layer 33, the tunnel barrier layer 32, and the storage layer 31. That is, the film thickness of the insulating layer 38 decreases. Therefore, in consideration of the film thickness of the insulating layer 38 receding during the etching, it is necessary to previously deposit the insulating layer 38 larger than the desired film thickness. More specifically, the insulating layer 38 is formed such that the film thickness is left at least 1 nm.

Thus, the magnetoresistive element MTJ of the first embodiment is formed.

[2-3] Effect of First Embodiment

According to the first embodiment, in the magnetoresistive element MTJ, the reference layer 40 comprises the reference-layer body layer 34 and the reference-layer interface layer 33 located at the interface on the side of the tunnel barrier layer 32, and the reference-layer interface layer 33 has the permeability higher than that of the reference-layer body layer 34 and the diameter larger than that of the reference-layer body layer 34. Therefore, the following effects can be obtained.

FIG. 8 is a view illustrating the stray field from the reference-layer body layer 34 in the magnetoresistive element MTJ of the first embodiment. As illustrated in FIG. 8, the stray field generated from the reference-layer body layer 34 concentrates on the reference-layer interface layer 33. That is, the stray field is generated along the in-plane direction of the reference-layer interface layer 33. Therefore, the stray field does not act on the storage layer 31. Particularly, the reference-layer interface layer 33 has the diameter larger than that of the reference-layer body layer 34, and the reference-layer interface layer 33 is formed so as to cover the upper surface of the storage layer 31. Therefore, the action of the stray field from the reference-layer body layer 34, which concentrates on the end portion of the storage layer 31, can be suppressed.

The stray field concentrates on the reference-layer interface layer 33, which allows an interaction of the stray field to be suppressed between the magnetoresistive elements MTJ adjacent to each other.

Because the action of the stray field from the reference-layer body layer 34 on the storage layer 31 is suppressed, the reduction of the write current and the improvement of the retention characteristic of the magnetoresistive element MTJ are achieved, the variation in write current can be suppressed among the magnetoresistive elements MTJ in the memory cell array MA.

In the magnetoresistive element MTJ, the relative permeability of the reference-layer interface layer 33 is set to 50, the film thickness of the reference-layer interface layer 33 is set to 3 nm, the diameter of the reference-layer interface layer 33 is set to 45 nm (the diameter of the storage layer 31 is also set to 45 nm), and the diameter of the reference-layer body layer 34 is set to 36 nm (first embodiment). The relative permeability of the reference-layer interface layer 33 is set to 50, the film thickness of the reference-layer interface layer 33 is set to 3 nm, the diameter of the reference-layer interface layer 33 is set to 45 nm (the diameter of the storage layer 31 is also set to 45 nm), and the diameter of the reference-layer body layer 34 is set to 45 nm (comparative example 1). A write characteristic of the first embodiment was compared to a write characteristic of the comparative example 1.

In the comparative example 1, the write current was 50 μA during the write of "1" from "0" at 50 nm. On the other hand, in the first embodiment, the write current was 25 μA. That is, in the first embodiment, the write current can be reduced to a half compared with the comparative example 1.

<3> Second Embodiment

A magnetoresistive element MTJ according to a second embodiment will be described with reference to FIGS. 9 to 11. In the magnetoresistive element MTJ of the second embodiment, by way of example, a shielding layer 90 having the permeability higher than that of a reference-layer body layer 34 is formed on the side surface of the reference-layer body layer 34. The magnetoresistive element MTJ of the second embodiment will be described in detail. In the second embodiment, the description of the same point as the first embodiment is omitted, and a different point is mainly described.

[3-1] Structure of Second Embodiment

The structure of the magnetoresistive element MTJ of the second embodiment will be described.

Figure 9:
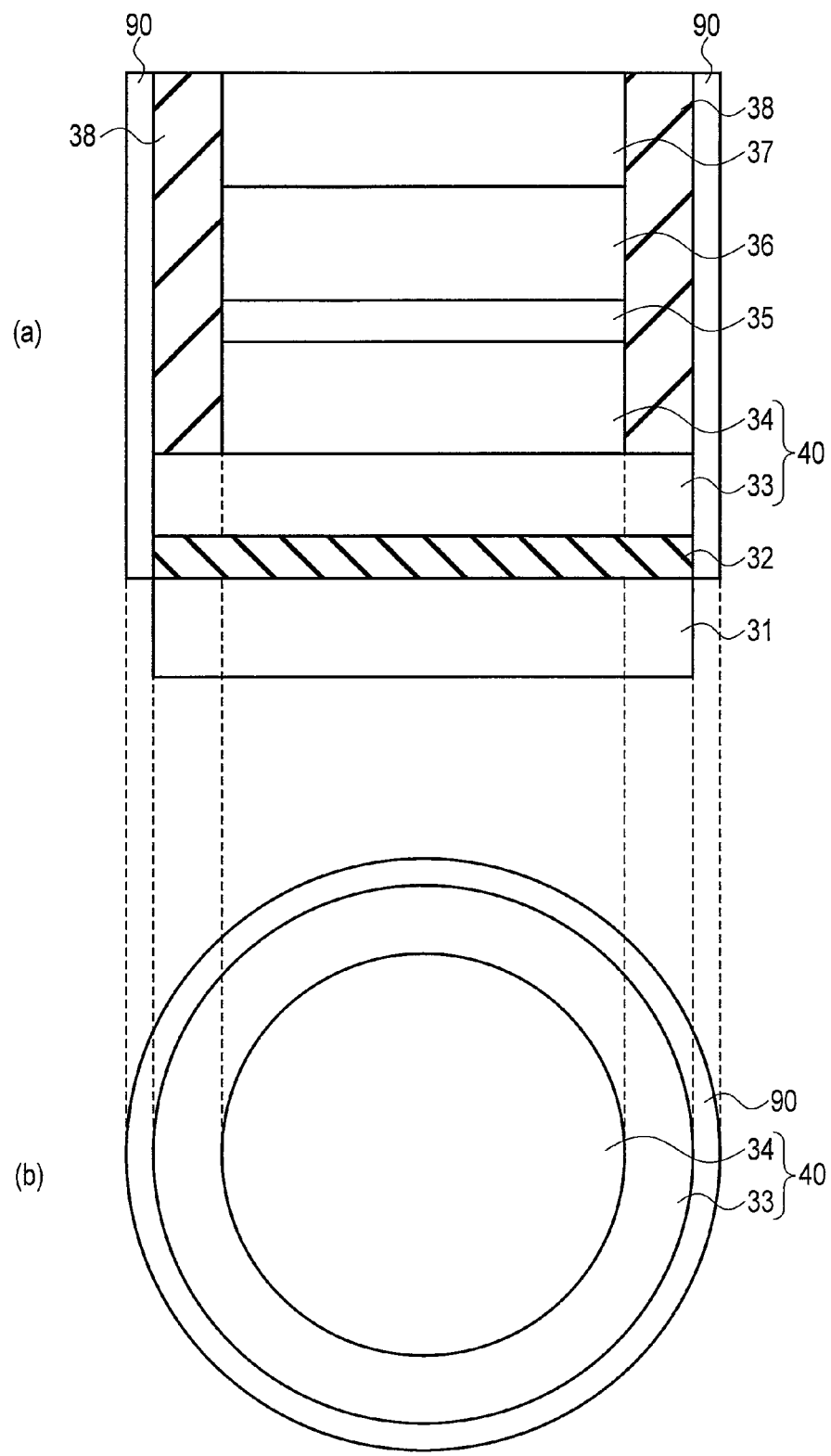
FIG. 9 is view illustrating a structure of a magnetoresistive element MTJ according to a second embodiment.

FIG. 9 is view illustrating a structure of the magnetoresistive element MTJ of the second embodiment. More specifically, (a) of FIG. 9 is a sectional view illustrating the structure of the magnetoresistive element MTJ, and (b) of FIG. 9 is a plan view illustrating the structure of the magnetoresistive element MTJ.

As illustrated in FIG. 9, the second embodiment differs from the first embodiment in that the shielding layer 90 is formed on the side surface of the reference-layer body layer 34.

More specifically, the shielding layer 90 is formed on the side surfaces of a tunnel barrier layer 32, a reference-layer interface layer 33, and an insulating layer 38. In other words, the shielding layer 90 is formed so as to cover surroundings of the tunnel barrier layer 32, the reference-layer interface layer 33, the reference-layer body layer 34, an AFC layer 35, a shift canceling layer 36, and a hard mask 37. The shielding layer 90 is not formed on the side surface of a storage layer 31. The shielding layer 90 is contact with the reference-layer interface layer 33 and continuously formed with the reference-layer interface layer 33, so that the shielding layer 90 integrates with the reference-layer interface layer 33. Therefore, the side surface on the lower side of the reference-layer body layer 34 is covered with the shielding layer 90 and the reference-layer interface layer 33. Therefore, the stray field can completely be blocked from the reference-layer body layer 34 by the shielding layer 90 and the reference-layer interface layer 33.

It is only necessary that the shielding layer 90 contact the reference-layer interface layer 33 and be formed on the side surface on the lower side of the reference-layer body layer 34 with the insulating layer 38 interposed therebetween, but it is no necessary that the shielding layer 90 be not formed on the side surface on the upper side of the reference-layer body layer 34 and side surfaces of the AFC layer 35, the shift canceling layer 36, and the hard mask 37.

The shielding layer 90 is made of a material having the permeability higher than that of the reference-layer body layer 34, namely, a soft magnetic material. More specifically, for example, the shielding layer 90 is made of a ferromagnetic material containing at least one element of Co, Fe, and Ni. In the shielding layer 90, a combined composition ratio of at least one element of Co, Fe, and Ni is greater than or equal to 1%. The permeability of the shielding layer 90 is higher than that of the reference-layer body layer 34, which allows the stray field from the reference-layer body layer 34 to be concentrated along the shielding layer 90.

That is, the permeability of the shielding layer 90 and the permeability of the reference-layer interface layer 33 are higher than that of the reference-layer body layer 34, and the shielding layer 90, the reference-layer interface layer 33, and the reference-layer body layer 34 are continuously formed while contacting each other, which allows the shielding layer 90 and the reference-layer interface layer 33 to act as a magnetic circuit. Therefore, the stray field from the reference-layer body layer 34 does not act on the storage layer 31.

The shielding layer 90 may be formed by a later-described deposition method, or the shielding layer 90 may be a re-deposition object, which is formed such that an etched material of the storage layer 31 re-adheres by etching the storage layer 31. Therefore, in the case that the shielding layer 90 is the re-deposition object, the shielding layer 90 contains the material (Co, Fe, or Ni) that is contained by the storage layer 31.

[3-2] Producing Method of Second Embodiment

A method for producing the magnetoresistive element MTJ of the second embodiment will be described below.

FIG. 10 is a sectional view illustrating a process of producing the magnetoresistive element MTJ of the second embodiment.

Similarly to the first embodiment, the processes in FIGS. 4 to 7 are performed. That is, the insulating layer 38 is formed on the side surfaces of the etched reference-layer body layer 34, AFC layer 35, shift canceling layer 36, and hard mask 37.

As illustrated in FIG. 10, with the hard mask 37 and the insulating layer 38 as a mask, the reference-layer interface layer 33, the tunnel barrier layer 32, and the storage layer 31 are processed by the IBE. Therefore, the storage layer 31, the tunnel barrier layer 32, the reference-layer interface layer 33 are processed such that the diameters of the storage layer 31, the tunnel barrier layer 32, the reference-layer interface layer 33 are larger than those of the reference-layer body layer 34, the AFC layer 35, the shift canceling layer 36, and the hard mask 37 by a double of the film thickness of the insulating layer 38.

At this point, in the second embodiment, the storage layer 31 is physically etched by an ion beam from the direction perpendicular to the film surface. The physical etching, such as the IBE, is an etching method in which an atom is caused to collide with the etched material to physically etch the etched material. Therefore, what is call a re-deposition phenomenon in which the etched material re-adheres to the side surface of the magnetoresistive element MTJ is generated after the etching.

That is, as illustrated in FIG. 9, the etched material (Co, Fe, or Ni) of the storage layer 31 re-adheres to the side surface of the magnetoresistive element MTJ to form the re-deposition object. More specifically, the etched material of the storage layer 31 adheres to the side surfaces of the tunnel barrier layer 32, the reference-layer interface layer 33, and the insulating layer 38 to form the shielding layer 90 (re-deposition object). In other words, the shielding layer 90 is formed so as to cover surroundings of the tunnel barrier layer 32, the reference-layer interface layer 33, the reference-layer body layer 34, the AFC layer 35, the shift canceling layer 36, and the hard mask 37. At this point, the re-deposition object does not adhere to the side surface of the storage layer 31. The shielding layer 90 is contact with the reference-layer interface layer 33 and continuously formed with the reference-layer interface layer 33, so that the shielding layer 90 integrates with the reference-layer interface layer 33. Therefore, the side surface on the lower side of the reference-layer body layer 34 is covered with the shielding layer 90 and the reference-layer interface layer 33.

The physical etching is not limited to the etching that is physically performed by the collision of the atom without a chemical reaction, but the physical etching may partially be accompanied with the chemical reaction. That is, the method for etching the storage layer 31 is not limited to the IBE, but the RIE with an inert gas having a poor reactive property may be used.

The shielding layer 90 is not limited to the re-deposition object. That is, the shielding layer 90 may be formed after the process of etching the reference-layer interface layer 33, the tunnel barrier layer 32, and the storage layer 31. More specifically, for example, after the soft magnetic layer containing Co, Fe, or Ni is formed on the whole surface (the side surface and the upper surface of the magnetoresistive element MTJ)

by the CVD method, the PVD method, or the ALD method, only the side surface is left while the upper surface is removed, and the shielding layer 90 may be formed.

Thus, the magnetoresistive element MTJ of the second embodiment is formed.

[3-3] Effect of Second Embodiment

According to the second embodiment, in the magnetoresistive element MTJ, the reference-layer interface layer 33 has the permeability higher than that of the reference-layer body layer 34 and the diameter larger than that of the reference-layer body layer 34, and the shielding layer 90 having the permeability higher than that of the reference-layer body layer 34 is formed on the side surface of the reference-layer body layer 34. Therefore, the following effects can be obtained.

FIG. 11 is a view illustrating the stray field from the reference-layer body layer 34 in the magnetoresistive element MTJ of the second embodiment. As illustrated in FIG. 11, because the reference-layer interface layer 33 and the shielding layer 90 are formed while contacting each other, the stray field generated from the reference-layer body layer 34 concentrates on the reference-layer interface layer 33 and the shielding layer 90. That is, the stray field is generated along the in-plane directions of the reference-layer interface layer 33 and the shielding layer 90. Therefore, the stray field does not act on the storage layer 31.

The shielding layer 90 can particularly suppress the interaction of the stray field between the magnetoresistive elements MTJ adjacent to each other. That is, the shielding layer 90 can suppress not only the stray field to the adjacent magnetoresistive element MTJ but also the stray field from the adjacent magnetoresistive element MTJ.

Accordingly, in the memory cell array MA, the reduction of the write current of the magnetoresistive element MTJ and the improvement of the retention characteristic can further be achieved, and the variation in write current among the magnetoresistive elements MTJ in the memory cell array MA can be suppressed.

The reference-layer interface layer 33 and the shielding layer 90 are continuously formed while contacting each other, and the side surface on the lower side of the reference-layer body layer 34 is completely covered. Therefore, the stray field acting on the storage layer 31 from the reference-layer body layer 34 can further be suppressed. Accordingly, the reduction of the write current of the magnetoresistive element MTJ, the improvement of the retention characteristic, and the variation in write current among the magnetoresistive elements MTJ can be suppressed.

The case that the magnetoresistive element MTJ comprises the shielding layer 90 (second embodiment) and the case that the magnetoresistive element MTJ does not comprise the shielding layer 90 (comparative example 2) were compared to each other in the variation in write current among the magnetoresistive elements MTJ in the memory cell array MA and the retention characteristic of the magnetoresistive element MTJ. The comparison was performed in the MRAM comprising the 2-Mbit memory cell array MA.

In the comparative example 2, the variation in write current among the magnetoresistive elements MTJ in the memory cell array MA was 15%. On the other hand, in the second embodiment, the variation in write current was 6%.

In the comparative example 2, storage energy ($ku \cdot V/kB \cdot T$: ku is anisotropic energy of a magnetic material, V is a volume, kB is a Boltzmann constant, and T is room temperature) that is an index of the retention characteristic of the magnetoresistive element MTJ was 50 kBT in an average of the memory cell array MA. On the other hand, in the second embodiment, the storage energy was 80 kBT in an average of the memory cell array MA. The storage energy of 80 kBT can guarantee the data retention for 10 years at a temperature of 85° C.

In the magnetoresistive element MTJ of the second embodiment, both the retention characteristic and the variation in write current are improved compared with the comparative example 2.

<4> Third Embodiment

A magnetoresistive element MTJ according to a third embodiment will be described with reference to FIGS. 12 to 14. The third embodiment is a modification of the second embodiment. In the magnetoresistive element MTJ of the third embodiment, a reference-layer interface layer 33 and a shielding layer 90 are not continuously formed. The magnetoresistive element MTJ of the third embodiment will be described below. In the third embodiment, the description of the same point as the first and second embodiments is omitted, and a different point is mainly described.

[4-1] Structure of Third Embodiment

The structure of the magnetoresistive element MTJ of the third embodiment will be described.

FIG. 12 is view illustrating the structure of the magnetoresistive element MTJ of the third embodiment. More specifically, (a) of FIG. 12 is a sectional view illustrating the structure of the magnetoresistive element MTJ, and (b) of FIG. 12 is a plan view illustrating the structure of the magnetoresistive element MTJ.

As illustrated in FIG. 12, the third embodiment differs from the second embodiment in that the reference-layer interface layer 33 and the shielding layer 90 do not contact each other.

More specifically, the shielding layer 90 is formed on the side surface of the insulating layer 38. In other words, the shielding layer 90 is formed so as to cover surroundings of a reference-layer body layer 34, an AFC layer 35, a shift canceling layer 36, and a hard mask 37. The shielding layer 90 is not formed on the side surfaces of a storage layer 31, a tunnel barrier layer 32, and the reference-layer interface layer 33. That is, the reference-layer interface layer 33 and the shielding layer 90 are discontinuously formed. The shielding layer 90 may be formed into the tapered shape in which the outer diameter (film thickness) increases from the lower side toward the upper side.

At this point, a closest distance between the shielding layer 90 and the reference-layer interface layer 33 is less than or equal to 10 nm. That is, a distance between the end portion (a side end in the drawings) of the reference-layer interface layer 33 and the end portion (a lower end in the drawings) of the shielding layer 90 is less than or equal to 10 nm. This is because the stray field acting on the storage layer 31 decreases in the case that the closest distance between the shielding layer 90 and the reference-layer interface layer 33 is less than or equal to 10 nm in the magnetostatic simulation.

The shielding layer 90 is made of a material having the permeability higher than that of the reference-layer body layer 34, namely, a soft magnetic material. More specifically, for example, the shielding layer 90 is made of a ferromagnetic material containing at least one element of Co, Fe, and Ni. In the shielding layer 90, the combined composition ratio of at least one of element of Co, Fe, or Ni is greater than or equal to 1%. The permeability of the shielding layer 90 is higher than that of the reference-layer body layer 34, which allows the stray field from the reference-layer body layer 34 to be concentrated along the shielding layer 90.

That is, the permeability of the shielding layer 90 and the permeability of the reference-layer interface layer 33 are higher than that of the reference-layer body layer 34, and the distance between the shielding layer 90 and the reference-layer interface layer 33 and the distance between the shielding layer 90 and the reference-layer body layer 34 are less than or equal to 10 nm, which allows the shielding layer 90 and the reference-layer interface layer 33 to act as the magnetic circuit. Therefore, the stray field from the reference-layer body layer 34 does not act on the storage layer 31.

[4-2] Producing Method of Third Embodiment

A method for producing the magnetoresistive element MTJ of the third embodiment will be described below.

FIG. 13 is a sectional view illustrating a process of producing the magnetoresistive element MTJ of the third embodiment.

Similarly to the first embodiment, the processes in FIGS. 4 to 7 are performed. That is, the insulating layer 38 is formed on the side surfaces of the etched reference-layer body layer 34, AFC layer 35, shift canceling layer 36, and hard mask 37.

As illustrated in FIG. 13, with the hard mask 37 and the insulating layer 38 as a mask, the reference-layer interface layer 33, the tunnel barrier layer 32, and the storage layer 31 are processed by the IBE. Therefore, the storage layer 31, the tunnel barrier layer 32, the reference-layer interface layer 33 are processed such that the diameters of the storage layer 31, the tunnel barrier layer 32, the reference-layer interface layer 33 are larger than those of the reference-layer body layer 34, the AFC layer 35, the shift canceling layer 36, and the hard mask 37 by a double of the film thickness of the insulating layer 38.

At this point, in the third embodiment, the storage layer 31 is physically etched by the ion beam from a direction oblique to the film surface rather than the direction perpendicular to the film surface. More specifically, the storage layer 31 is etched by the ion beam from the direction oblique to the perpendicular direction toward the outside by θ≤about 5°. Therefore, the etched material (Co, Fe, or Ni) of the storage layer 31 adheres to the side surface of the magnetoresistive element MTJ to form the re-deposition object, the etching of the re-deposition object progresses by the ion beam from the oblique direction. That is, the film thickness of the re-deposition object increases from the lower side toward the upper side. In other words, the re-deposition object is formed into the tapered shape in which the outer diameter increases from the lower side toward the upper side.

Therefore, as illustrated in FIG. 12, the etched material of the storage layer 31 adheres only to the side surface of the insulating layer 38 to form the shielding layer 90 (re-deposition object). In other words, the shielding layer 90 is formed so as to cover surroundings of the reference-layer body layer 34, the AFC layer 35, the shift canceling layer 36, and the hard mask 37.

Because the etching progresses by the ion beam from the oblique direction, the re-deposition object is not formed on the side surfaces of the tunnel barrier layer 32 and the reference-layer interface layer 33. That is, the shielding layer 90 is discontinuously formed without contacting the reference-layer interface layer 33. At this point, when the irradiation angle of the ion beam is set to θ≤5°, the distance between the end portion (the side end in the drawings) of the reference-layer interface layer 33 and the end portion (the lower end in the drawings) of the shielding layer 90 can be decreased less than or equal to 10 nm.

Thus, the magnetoresistive element MTJ of the third embodiment is formed.

[4-3] Effect of Third Embodiment

According to the third embodiment, in the magnetoresistive element MTJ, the reference-layer interface layer 33 has the permeability higher than that of the reference-layer body layer 34 and the diameter larger than that of the reference-layer body layer 34, and the shielding layer 90 having the permeability higher than that of the reference-layer body layer 34 is formed on the side surface of the reference-layer body layer 34. Therefore, the following effects can be obtained.

FIG. 14 is a view illustrating the stray field from the reference-layer body layer 34 in the magnetoresistive element MTJ of the third embodiment. As illustrated in FIG. 14, because the closest distance between the reference-layer interface layer 33 and the shielding layer 90 is less than or equal to 10 nm, the stray field generated from the reference-layer body layer 34 concentrates on the reference-layer interface layer 33 and the shielding layer 90. That is, the stray field is generated along the in-plane directions of the reference-layer interface layer 33 and the shielding layer 90. Therefore, the stray field does not act on the storage layer 31.

The shielding layer 90 can particularly suppress the interaction of the stray field between the magnetoresistive elements MTJ adjacent to each other. That is, the shielding layer 90 can suppress not only the stray field to the adjacent magnetoresistive element MTJ but also the stray field from the adjacent magnetoresistive element MTJ.

Accordingly, in the memory cell array MA, the reduction of the write current of the magnetoresistive element MTJ and the improvement of the retention characteristic can further be achieved, and the variation in write current among the magnetoresistive elements MTJ in the memory cell array MA can be suppressed.

In the magnetoresistive element MTJ of the third embodiment in the memory cell array MA, the variation in write current among the magnetoresistive elements MTJ and the retention characteristic of the magnetoresistive element MTJ were studied. The study was performed in the MRAM comprising the 2-Mbit memory cell array MA.

In the third embodiment, the variation in write current among the magnetoresistive elements MTJ in the memory cell array MA was 8%. In the third embodiment, the storage energy was 75 kBT in the average of the memory cell array MA.

In the magnetoresistive element MTJ of the third embodiment, both the retention characteristic and the variation in write current are improved compared with the comparative example 2.

According to the third embodiment, in the process of etching the storage layer 31, the ion-beam irradiation angle is not limited to the perpendicular direction, but the ion-beam irradiation angle may be set to the oblique direction. Therefore, a process margin can be improved.

<5> Fourth Embodiment

A magnetoresistive element MTJ according to a fourth embodiment will be described with reference to FIGS. 15 to 20. In the magnetoresistive element MTJ of the fourth embodiment, by way of example, a reference-layer interface layer 33 is substantially equal to a reference-layer body layer 34 in the diameter, and a shielding layer 90 is formed on the side surfaces of the reference-layer interface layer 33 and the reference-layer body layer 34. The magnetoresistive element MTJ of the fourth embodiment will be described in detail below. In the fourth embodiment, the description of the same point as the first to third embodiments is omitted, and a different point is mainly described.

[5-1] Structure of Fourth Embodiment

A structure of the magnetoresistive element MTJ of the fourth embodiment will be described.

Figure 15:
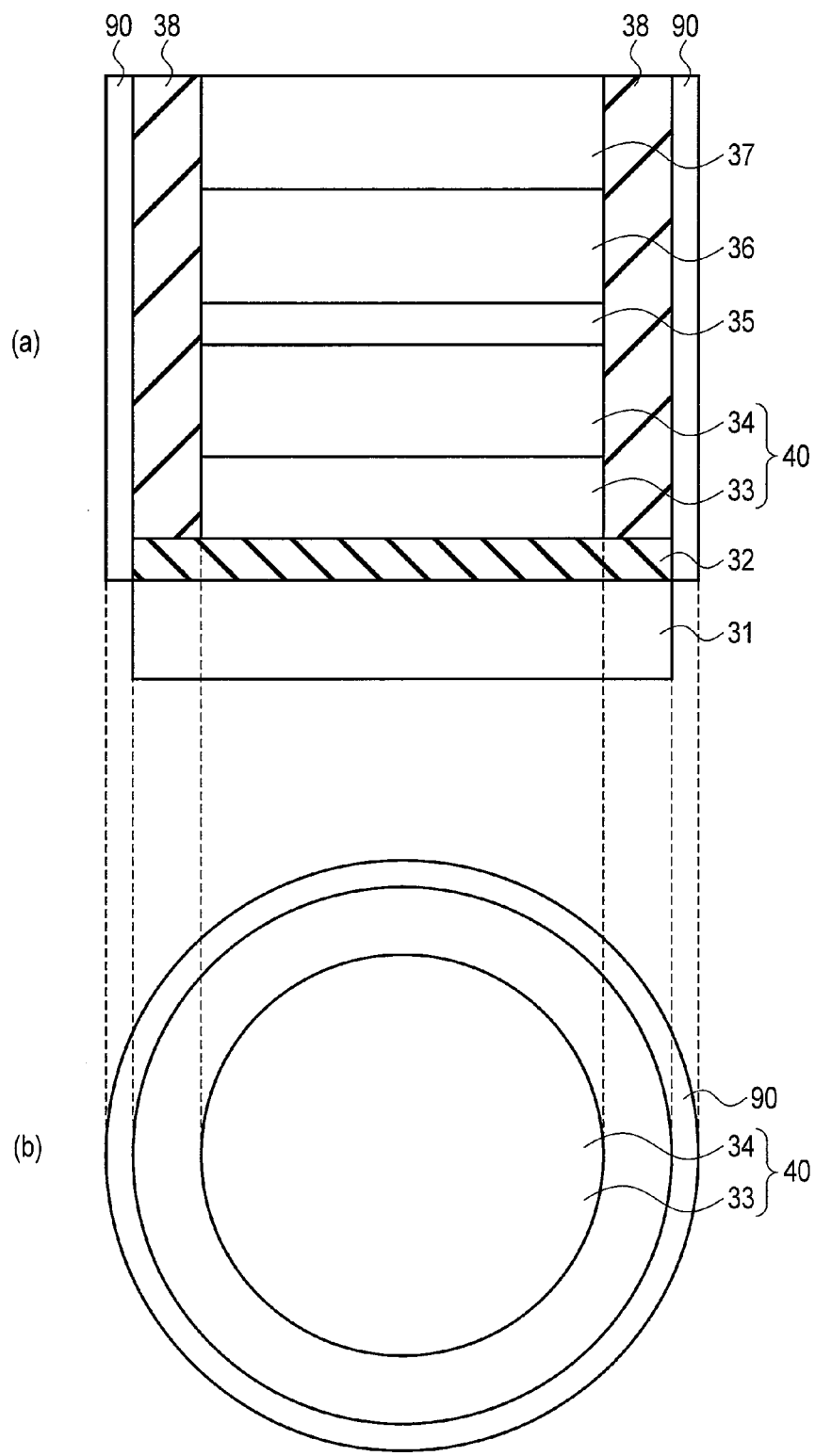
FIG. 15 is view illustrating a structure of a magnetoresistive element MTJ according to a fifth embodiment.

FIG. 15 is view illustrating a structure of the magnetoresistive element MTJ of the fifth embodiment. More specifically, (a) of FIG. 15 is a sectional view illustrating the structure of the magnetoresistive element MTJ, and (b) of FIG. 15 is a plan view illustrating the structure of the magnetoresistive element MTJ.

As illustrated in FIG. 15, the fourth embodiment differs from the first embodiment in that the reference-layer interface layer 33 is substantially equal to the reference-layer body layer 34 in the diameter, and that the shielding layer 90 is formed on the side surfaces of the reference-layer interface layer 33 and the reference-layer body layer 34.

The reference-layer interface layer 33 is substantially equal to the reference-layer body layer 34 in the diameter, and the diameters of the reference-layer interface layer 33 and the reference-layer body layer 34 are smaller than those of a tunnel barrier layer 32 and a storage layer 31, which are located below the reference-layer interface layer 33 and the reference-layer body layer 34. That is, the reference-layer interface layer 33 and the reference-layer body layer 34 are located in the central portion in the planes of the tunnel barrier layer 32 and the storage layer 31. In other words, the end portions in the planes of the tunnel barrier layer 32 and the storage layer 31 project from the end portions in the planes of the reference-layer interface layer 33 and the reference-layer body layer 34. The diameters of the reference-layer interface layer 33 and the reference-layer body layer 34 are substantially equal to the diameters of an AFC layer 35, a shift canceling layer 36, and a hard mask 37, which are located above the reference-layer interface layer 33 and the reference-layer body layer 34.

An insulating layer 38 is formed on the side surfaces of the reference-layer interface layer 33, the reference-layer body layer 34, the AFC layer 35, the shift canceling layer 36, and the hard mask 37 and on the side surface of projected end portion of the tunnel barrier layer 32. In other words, the insulating layer 38 is formed so as to cover surroundings of the reference-layer interface layer 33, the reference-layer body layer 34, the AFC layer 35, the shift canceling layer 36, and the hard mask 37.

The shielding layer 90 is formed on the side surfaces of the tunnel barrier layer 32 and the insulating layer 38. In other words, the shielding layer 90 is formed so as to cover the surrounding of the tunnel barrier layer 32, the reference-layer interface layer 33, the reference-layer body layer 34, the AFC layer 35, the shift canceling layer 36, and the hard mask 37. The shielding layer 90 is not formed on the side surface of the storage layer 31. The shielding layer 90 is formed on the side surface of the reference-layer interface layer 33 with the insulating layer 38 interposed therebetween.

At this point, the closest distance between the shielding layer 90 and the reference-layer interface layer 33 is less than or equal to 10 nm. That is, the film thickness of the insulating layer 38 located between the shielding layer 90 and the reference-layer interface layer 33 is less than or equal to 10 nm. This is because the stray field acting on the storage layer 31 decreases in the case that the closest distance between the shielding layer 90 and the reference-layer interface layer 33 is less than or equal to 10 nm in the magnetostatic simulation. Therefore, a difference between the diameters of the reference-layer interface layer 33 and the reference-layer body layer 34 and the diameters of the tunnel barrier layer 32 and the storage layer 31 is less than or equal to 20 nm.

The shielding layer 90 is made of a material having the permeability higher than that of the reference-layer body layer 34, namely, a soft magnetic material. More specifically, for example, the shielding layer 90 is made of a ferromagnetic material containing at least one element of Co, Fe, and Ni. In the shielding layer 90, the combined composition ratio of at least one of element of Co, Fe, or Ni is greater than or equal to 1%. The permeability of the shielding layer 90 is higher than that of the reference-layer body layer 34, which allows the stray field from the reference-layer body layer 34 to be concentrated along the shielding layer 90.

That is, the permeability of the shielding layer 90 and the permeability of the reference-layer interface layer 33 are higher than that of the reference-layer body layer 34, and the distance between the shielding layer 90 and the reference-layer interface layer 33 and the distance between the shielding layer 90 and the reference-layer body layer 34 are less than or equal to 10 nm, which allows the shielding layer 90 and the reference-layer interface layer 33 to act as the magnetic circuit. Therefore, the stray field from the reference-layer body layer 34 does not act on the storage layer 31.

[5-2] Producing Method of Fourth Embodiment

A method for producing the magnetoresistive element MTJ of the fourth embodiment will be described below.

FIGS. 16 to 19 are sectional views illustrating a process of producing the magnetoresistive element MTJ of the fourth embodiment.

Similarly to the first embodiment, the process in FIG. 4 is performed. That is, the storage layer 31, the tunnel barrier layer 32, the reference-layer interface layer 33, the reference-layer body layer 34, the AFC layer 35, the shift canceling layer 36, and the hard mask 37 are sequentially formed on the lower electrode 27.

As illustrated in FIG. 16, a resist mask (not illustrated) is formed on the hard mask 37 to perform the photolithography. Then, using the resist mask, the hard mask 37 is processed by the RIE. Then the resist mask is removed.

Then, with the hard mask 37 as a mask, the shift canceling layer 36, the AFC layer 35, the reference-layer body layer 34, and the reference-layer interface layer 33 are processed by the RIE or the IBE. Therefore, the upper surface of the tunnel barrier layer 32 is exposed in a region where the shift canceling layer 36, the AFC layer 35, the reference-layer body layer 34, and the reference-layer interface layer 33 are etched.

As illustrated in FIG. 17, for example, the insulating layer 38 is formed in the conformal manner (evenly formed over the surface) by the CVD method, the PVD method, or the ALD method. That is, the insulating layer 38 is formed on the upper surface of the tunnel barrier layer 32, the side surfaces of the reference-layer interface layer 33, the reference-layer body layer 34, the AFC layer 35, the shift canceling layer 36, and the hard mask 37, and the upper surface of the hard mask 37.

For example, the insulating layer 38 is formed with the film thickness of 10 nm or less. In order to form the insulating layer 38 in the conformal manner, desirably the insulating layer 38 is formed by the ALD method.

As illustrated in FIG. 18, the insulating layer 38 is removed from the upper surfaces of the hard mask 37 and the tunnel barrier layer 32 by the anisotropic etching, for example, the RIE. Therefore, the insulating layer 38 is left on the side surfaces of the reference-layer interface layer 33, the reference-layer body layer 34, the AFC layer 35, the shift canceling layer 36, and the hard mask 37.

As illustrated in FIG. 19, with the hard mask 37 and the insulating layer 38 as a mask, the tunnel barrier layer 32 and the storage layer 31 are processed by the IBE. Therefore, the storage layer 31 and tunnel barrier layer 32 are processed such that the diameters of the storage layer 31 and tunnel barrier layer 32 are larger than those of the reference-layer interface layer 33, the reference-layer body layer 34, the AFC layer 35, the shift canceling layer 36, and the hard mask 37 by a double of the film thickness of the insulating layer 38. For example, the storage layer 31 and tunnel barrier layer 32 are processed such that the difference in diameter is less than or equal to 20 nm.

At this point, in the fourth embodiment, the storage layer 31 is physically etched by the ion beam from the direction perpendicular or oblique to the film surface.

Therefore, as illustrated in FIG. 15, the etched material of the storage layer 31 re-adheres to the side surface of the magnetoresistive element MTJ to form the re-deposition object. More specifically, the etched material of the storage layer 31 adheres to the side surfaces of the tunnel barrier layer 32 and the insulating layer 38 to form the shielding layer 90 (re-deposition object). In other words, the shielding layer 90 is formed so as to cover the surroundings of the tunnel barrier layer 32, the reference-layer interface layer 33, the reference-layer body layer 34, the AFC layer 35, the shift canceling layer 36, and the hard mask 37. At this point, the angle of the ion beam is adjusted such that the distance between the shielding layer 90 and the insulating layer 38 is less than or equal to 10 nm.

Thus, the magnetoresistive element MTJ of the fourth embodiment is formed.

[5-3] Effect of Fourth Embodiment

According to the fourth embodiment, in the magnetoresistive element MTJ, the reference-layer interface layer 33 is substantially equal to the reference-layer body layer 34 in the diameter, and the shielding layer 90 is formed on the side surfaces of the reference-layer interface layer 33 and the reference-layer body layer 34. Therefore, the following effects can be obtained.

FIG. 20 is a view illustrating the stray field from the reference-layer body layer 34 in the magnetoresistive element MTJ of the fourth embodiment. As illustrated in FIG. 20, because the closest distance between the reference-layer interface layer 33 and the shielding layer 90 is less than or equal to 10 nm, the stray field generated from the reference-layer body layer 34 concentrates on the reference-layer interface layer 33 and the shielding layer 90. That is, the stray field is generated along the in-plane directions of the reference-layer interface layer 33 and the shielding layer 90. Therefore, the stray field does not act on the storage layer 31.

The shielding layer 90 can particularly suppress the interaction of the stray field between the magnetoresistive elements MTJ adjacent to each other. That is, the shielding layer 90 can suppress not only the stray field to the adjacent magnetoresistive element MTJ but also the stray field from the adjacent magnetoresistive element MTJ.

Accordingly, in the memory cell array MA, the reduction of the write current of the magnetoresistive element MTJ and the improvement of the retention characteristic can further be achieved, and the variation in write current among the magnetoresistive elements MTJ in the memory cell array MA can be suppressed.

In the magnetoresistive element MTJ of the fourth embodiment in the memory cell array MA, the variation in write current among the magnetoresistive elements MTJ and the retention characteristic of the magnetoresistive element MTJ were studied. The study was performed in the MRAM comprising the 2-Mbit memory cell array MA.

In the fourth embodiment, the variation in write current among the magnetoresistive elements MTJ in the memory cell array MA was 8%. In the fourth embodiment, the storage energy was 75 kBT in the average of the memory cell array MA.

In the magnetoresistive element MTJ of the fourth embodiment, both the retention characteristic and the variation in write current are improved compared with the comparative example 2.

According to the fourth embodiment, the reference-layer interface layer 33 and the reference-layer body layer 34 are simultaneously processed. That is, the process of etching the reference-layer interface layer 33 and the reference-layer body layer 34 can be performed by the same method as the background art. Because the reference-layer interface layer 33 is substantially equal to the reference-layer body layer 34 in the diameter, there is no risk of decreasing the MR ratio of the reference-layer interface layer 33. Therefore, while the film thickness of the insulating layer 38 ranges from 2 nm to 6 nm in the first to third embodiments, the film thickness of the insulating layer 38 may be set to 10 nm or less in the fourth embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising:
a first magnetic layer, in which a magnetization direction is variable and is perpendicular to a film surface;
a tunnel barrier layer that is formed on the first magnetic layer; and
a second magnetic layer that is formed on the tunnel barrier layer, a magnetization direction of the second magnetic layer being invariable and being perpendicular to the film surface,
wherein the second magnetic layer comprises a body layer that constitutes an origin of perpendicular magnetic anisotropy, and an interface layer that is formed between the body layer and the tunnel barrier layer, the interface layer having a permeability higher than that of the body layer and a planar size larger than that of the body layer,
wherein a shielding layer having a permeability higher than that of the body layer is formed on a side surface of the body layer, and the shielding layer is formed into a tapered shape in which a film thickness increases from a lower portion side toward an upper portion side, and
wherein a closest distance between the interface layer and the shielding layer is less than or equal to 10 nm.

2. The element of claim 1, wherein the shielding layer is formed while contacting the interface layer.

3. The element of claim 1, wherein planar shapes of the interface layer and the body layer are a circular shape, and a difference in diameter between the interface layer and the body layer ranges from 2 nm to 6 nm.

4. The element of claim 1, wherein relative permeability of the interface layer is greater than or equal to 50.

5. The element of claim 1, wherein a film thickness of the interface layer ranges from 0.3 nm to 5 nm.

6. The element of claim 1, wherein the shielding layer contains at least one of Co, Fe, and Ni, and a composition ratio thereof in the shielding layer is greater than or equal to 1%.

7. The element of claim 1, wherein the interface layer contains at least one of Co, Fe, and Ni.

8. The element of claim 1, wherein the body layer comprises an alloy or a stacked structure, which contains Co, Fe, Pt, or Pd.

9. The element of claim 1, wherein an insulating layer is formed between the body layer and the shielding layer.

10. A magnetoresistive element comprising:
a first magnetic layer, in which a magnetization direction is variable and is perpendicular to a film surface;
a tunnel barrier layer that is formed on the first magnetic layer; and
a second magnetic layer that is formed on the tunnel barrier layer, a magnetization direction of the second magnetic layer being invariable and being perpendicular to the film surface,
wherein the second magnetic layer comprises a body layer that constitutes an origin of perpendicular magnetic anisotropy, and an interface layer that is formed between the body layer and the tunnel barrier layer, and wherein the interface layer has a permeability higher than that of the body layer, and the interface layer is equal to the body layer in the planar size, and
a shielding layer having a permeability higher than that of the body layer is formed on a side surface of the body layer.

11. The element of claim 10, wherein the shielding layer is formed while contacting the interface layer.

12. The element of claim 10, wherein a closest distance between the interface layer and the shielding layer is less than or equal to 10 nm.

13. The element of claim 10, wherein relative permeability of the interface layer is greater than or equal to 50.

14. The element of claim 10, wherein a film thickness of the interface layer ranges from 0.3 nm to 5 nm.

15. The element of claim 10, wherein the shielding layer contains at least one of Co, Fe, and Ni, and a composition ratio thereof in the shielding layer is greater than or equal to 1%.

* * * * *